(12) United States Patent
Inokuma et al.

(10) Patent No.: US 10,403,636 B2
(45) Date of Patent: Sep. 3, 2019

(54) SEMICONDUCTOR MEMORY DEVICE AND METHOD FOR MANUFACTURING THE SAME

(71) Applicant: Toshiba Memory Corporation, Minato-ku (JP)

(72) Inventors: Hideki Inokuma, Yokkaichi (JP); Osamu Matsuura, Kuwana (JP); Masanari Fujita, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 108 days.

(21) Appl. No.: 15/263,464

(22) Filed: Sep. 13, 2016

(65) Prior Publication Data

US 2017/0263634 A1  Sep. 14, 2017

Related U.S. Application Data

(60) Provisional application No. 62/307,087, filed on Mar. 11, 2016.

(51) Int. Cl.
| | |
|---|---|
| *H01L 27/115* | (2017.01) |
| *H01L 21/311* | (2006.01) |
| *H01L 21/28* | (2006.01) |
| *H01L 27/11582* | (2017.01) |
| *H01L 27/11565* | (2017.01) |
| *H01L 27/11575* | (2017.01) |

(52) U.S. Cl.
CPC .. *H01L 27/11582* (2013.01); *H01L 27/11565* (2013.01); *H01L 27/11575* (2013.01)

(58) Field of Classification Search
CPC ............... H01L 21/31105; H01L 27/11565

USPC .......................................................... 257/314
See application file for complete search history.

(56) References Cited

U.S. PATENT DOCUMENTS

| | | |
|---|---|---|
| 8,115,245 B2 | 2/2012 | Yoshimizu et al. |
| 8,546,786 B2 | 10/2013 | Yoshimizu et al. |
| 2011/0169067 A1 | 7/2011 | Ernst et al. |

(Continued)

FOREIGN PATENT DOCUMENTS

| | | |
|---|---|---|
| JP | 2010-80685 | 4/2010 |
| TW | 201436322 A | 9/2014 |

(Continued)

*Primary Examiner* — Moazzam Hossain
*Assistant Examiner* — Omar F Mojaddedi
(74) *Attorney, Agent, or Firm* — Oblon, McClelland, Maier & Neustadt, L.L.P.

(57) ABSTRACT

A semiconductor memory device according to the embodiment includes a substrate, electrodes, at least one pillar structure, at least one charge storage film, and at least one insulating member. The electrodes are provided on the substrate, are separately stacked each other, and constitute a stacked body. The electrodes have a first width in a first direction along a surface of the substrate and include a portion extending in a second direction crossing the first direction along the surface. The pillar structure is provided in the stacked body and includes a semiconductor layer extending in a stacking direction of the stacked body. The charge storage film is provided between the semiconductor layer and the electrodes. The insulating member has a width in the first direction smaller than the first width, pierces the electrodes, and is provided to extend in the stacking direction.

19 Claims, 22 Drawing Sheets

(56) References Cited

U.S. PATENT DOCUMENTS

| | | | |
|---|---|---|---|
| 2012/0064682 A1* | 3/2012 | Jang | H01L 21/28273 |
| | | | 438/268 |
| 2014/0264353 A1 | 9/2014 | Lai | |
| 2014/0346682 A1* | 11/2014 | Lee | H01L 27/11565 |
| | | | 257/776 |
| 2015/0060992 A1 | 3/2015 | Taekyung et al. | |
| 2015/0200200 A1 | 7/2015 | Sakuma et al. | |

FOREIGN PATENT DOCUMENTS

| | | |
|---|---|---|
| TW | 201513314 A | 4/2015 |
| TW | 201530742 A | 8/2015 |

* cited by examiner

SEMICONDUCTOR MEMORY DEVICE AND METHOD FOR MANUFACTURING THE SAME

CROSS-REFERENCE TO RELATED APPLICATION

This application is based upon and claims the benefit of priority from U.S. Provisional Patent Application 62/307,087, filed on Mar. 11, 2016; the entire contents of which are incorporated herein by reference.

FIELD

Embodiments are generally related to a semiconductor memory device and a method for manufacturing the same.

BACKGROUND

A memory device having a three-dimensional structure is proposed, in which memory holes are formed in a stacked body including electrode films stacked via an insulating film interposed, and a silicon body acting as a channel is provided on a side wall of the memory hole via a charge storage film. The electrode films are made of conductive material, and act as control gates of memory cells. In the case where the electrode films are formed of metal, stress such as compressive stress or tensile stress occurs in the electrode films. It is feared that a wafer has large warp due to such stress by the electrode films formed with a longer length in one direction.

BRIEF DESCRIPTION OF THE DRAWINGS

FIG. 10A and FIG. 10B to FIG. 14A and FIG. 14B are views showing a manufacturing method of the semiconductor memory device according to the first embodiment;

FIG. 21A and FIG. 21B to FIG. 24A and FIG. 24B are views showing a manufacturing method of the semiconductor memory device according to the second embodiment;

DETAILED DESCRIPTION

A semiconductor memory device according to the embodiment includes a substrate; a plurality of electrodes; at least one pillar structure; at least one charge storage film; and at least one insulating member. The plurality of electrodes is provided on the substrate, the electrodes are separately stacked each other and constitute a stacked body, the electrodes have a first width in a first direction along a surface of the substrate, and the electrodes include a portion extending in a second direction crossing the first direction along the surface. The pillar structure is provided in the stacked body and includes a semiconductor layer extending in a stacking direction of the stacked body. The charge storage film is provided between the semiconductor layer and the electrodes. The insulating member has a width in the first direction smaller than the first width, pierces the electrodes, and is provided to extend in the stacking direction.

Hereinafter, embodiments are described with reference to the drawings. It should be noted that the same elements are denoted with the same numeral or symbol, and all drawings described below are schematic ones. For example, in some drawings, some elements are omitted or illustrated in reduced number thereof for convenience in view. Also, the number of the elements and size ratio are not necessarily in consistent with each other between the drawings.

First Embodiment

Figure 1:
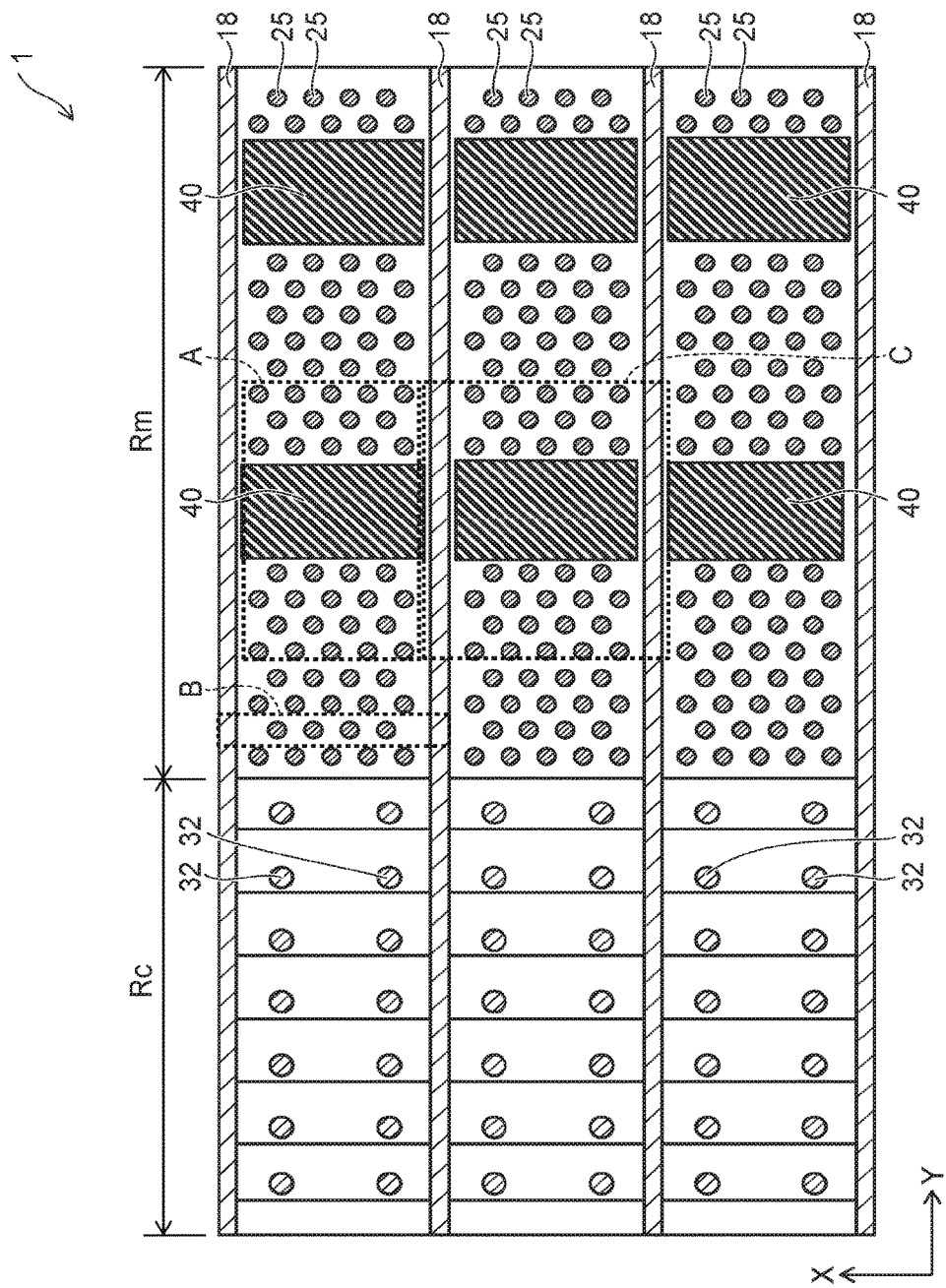
FIG. 1 is a plan view showing a semiconductor memory device according to a first embodiment.

FIG. 1 is a plan view showing a semiconductor memory device according to the first embodiment.

Figure 2:
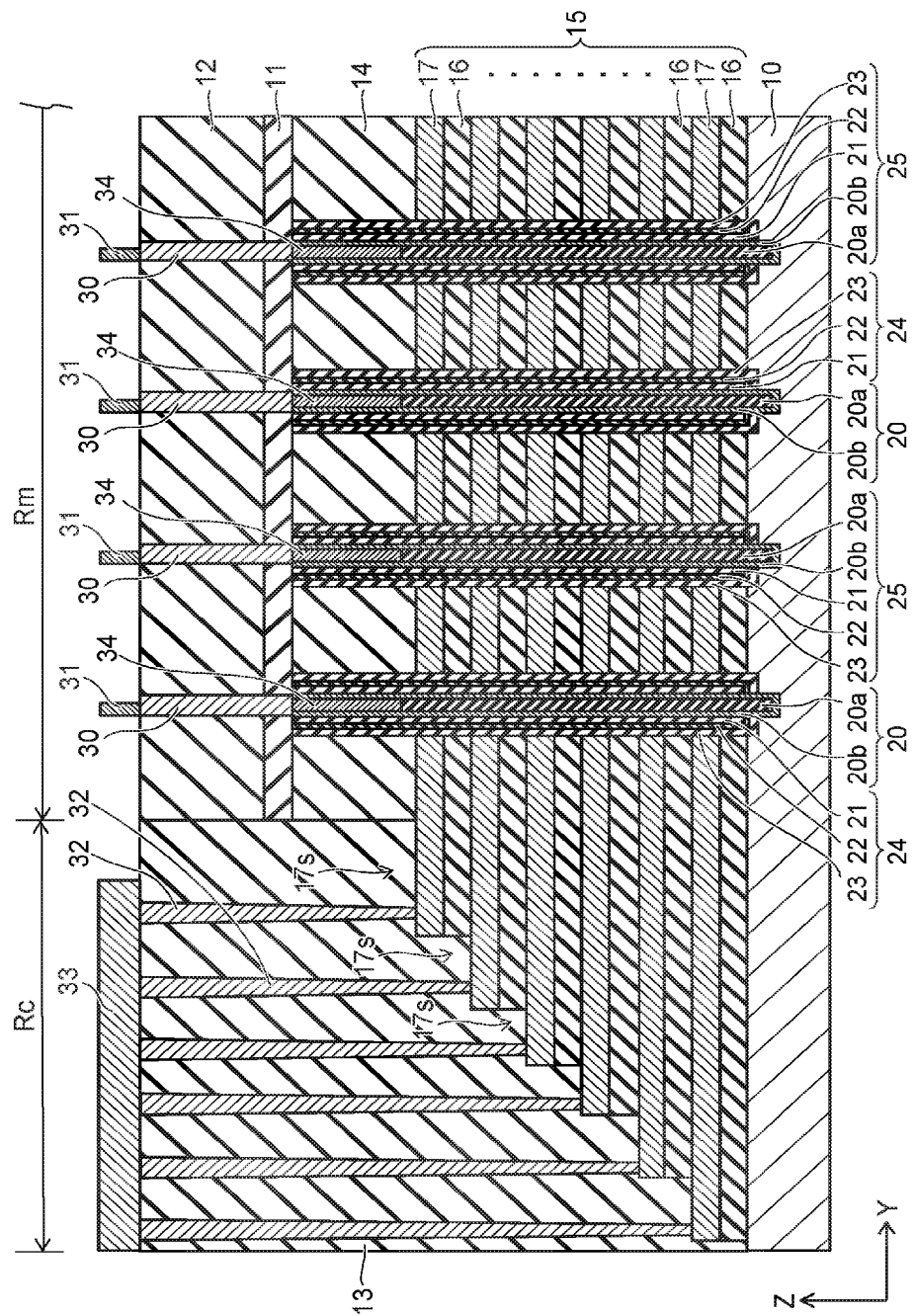
FIG. 2 is a cross-sectional view showing the semiconductor memory device according to the first embodiment.

FIG. 2 is a cross-sectional view showing the semiconductor memory device according to the first embodiment.

Figure 3:
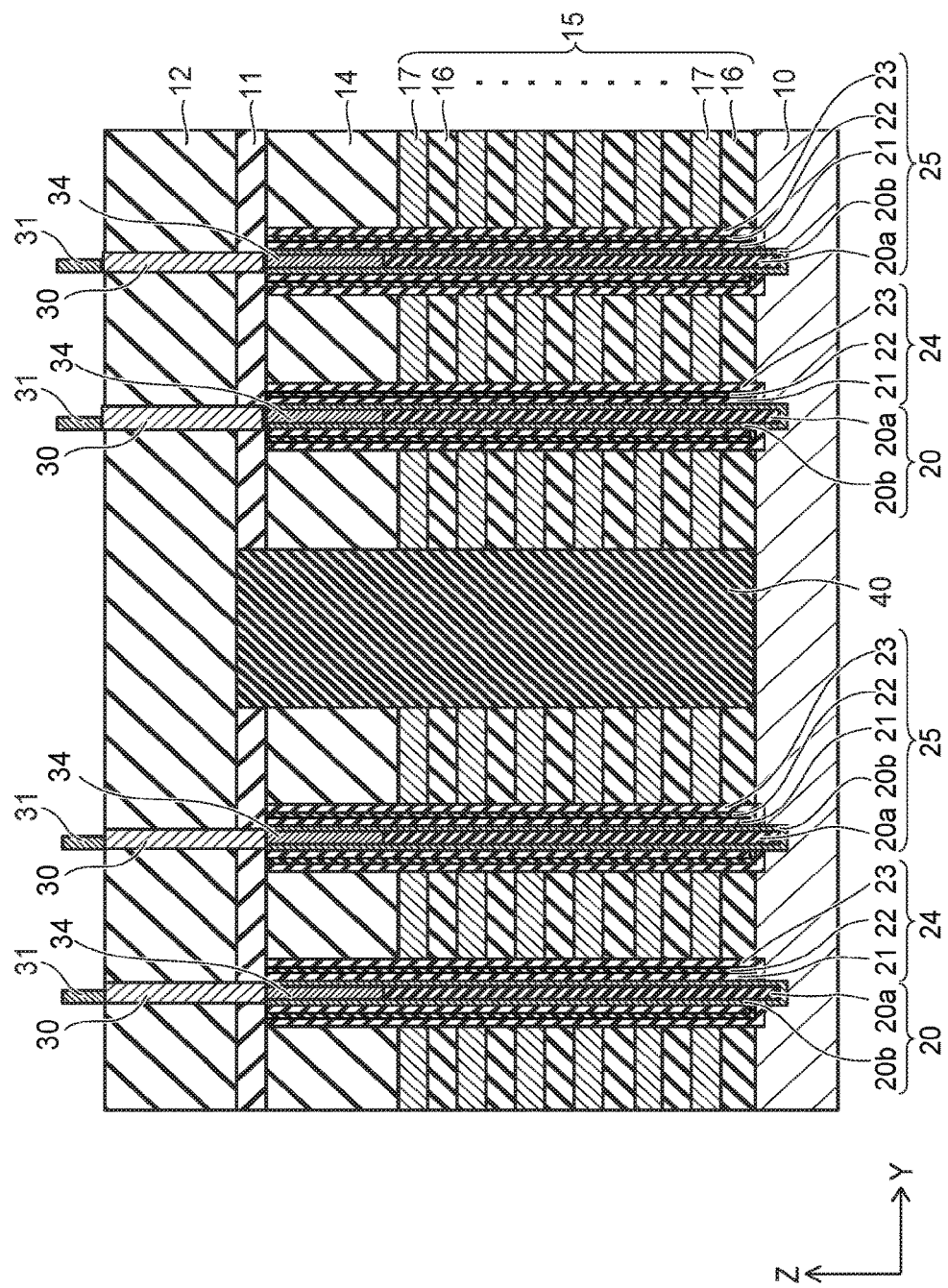
FIG. 3 is a cross-sectional view showing a part of the semiconductor memory device according to the first embodiment.

FIG. 3 is a cross-sectional view showing a part of the semiconductor memory device according to the first embodiment.

Figure 4:
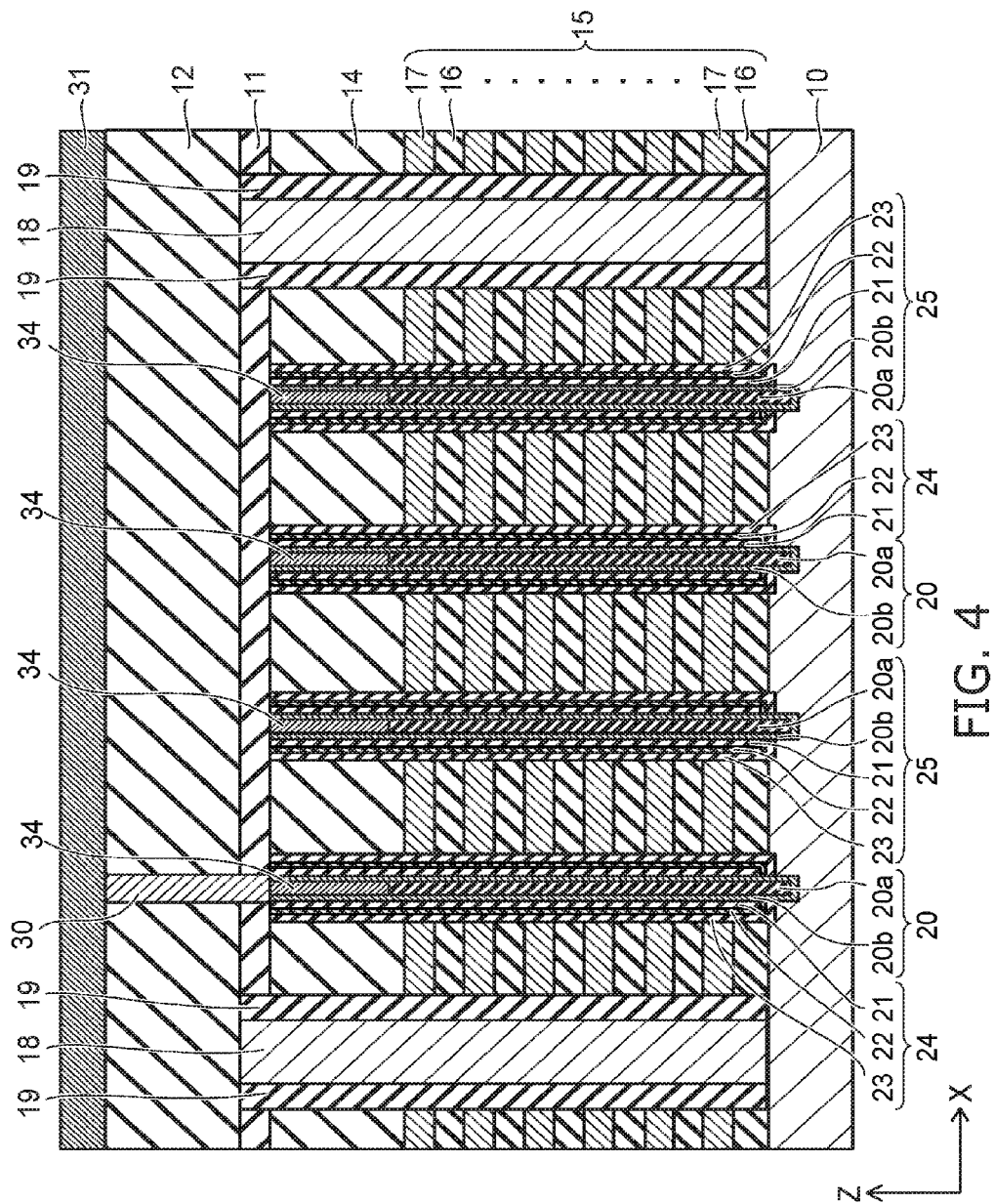
FIG. 4 is a cross-sectional view showing a part of the semiconductor memory device according to the first embodiment.

FIG. 4 is a cross-sectional view showing a part of the semiconductor memory device according to the first embodiment.

FIG. 1 shows the X-Y plan view of a semiconductor memory device 1. FIG. 2 shows the Y-Z cross-sectional view of the semiconductor memory device 1. FIG. 3 shows the Y-Z cross-sectional view of a region A of the semiconductor memory device 1. FIG. 4 shows the X-Z cross-sectional view of a region B of the semiconductor memory device 1.

In the semiconductor memory device 1 according to the embodiment, a substrate 10 such as a silicon substrate or the like is provided. Hereinafter, XYZ coordinate system is employed in the specification for convenience in description. Two directions parallel to a top surface of the substrate 10 and orthogonal to each other are defined as an "X-direction" and a "Y-direction", a direction orthogonal to both the X-direction and the Y-direction is defined as a "Z-direction".

As shown in FIG. 1 and FIG. 2, a memory cell region Rm and a contact region Rc are provided in the semiconductor memory device 1. The memory cell region Rm and the contact region Rc are arranged along the Y-direction.

Hereinafter, the memory cell region Rm is described.

A stacked body 15 and a columnar portion 25 are provided in the memory cell region Rm. In the stacked body 15, a plurality of insulating films 16 and a plurality of electrode films 17 are alternately stacked on a layer to layer in the Z-direction. An inter-layer insulating film 14 is provided on the stacked body 15. The insulating film 16 is, for example, formed of silicon oxide ($SiO_2$). In the electrode film 17, a main portion and a barrier metal layer are provided, the main portion is, for example, made of tungsten (W) or molybdenum (Mo), and the barrier metal layer is, for example, made of titanium nitride and covers a surface of the main portion. The inter-layer insulating film 14 is, for example, formed of silicon oxide.

The columnar portion 25 extends in the stacked body 15 in the Z-direction. The columnar portion 25 is, for example, formed into a circular pillar shape or an elliptic cylindrical shape. The columnar portion 25 is provided with a plurality, and the plurality of columnar portions 25 is disposed, for example, in staggered arrangement or at cross points of square grid in the X-Y plane.

As shown in FIG. 2, the columnar portion 25 includes a core portion 20a, a semiconductor body 20b, a tunneling insulating film 21, a charge storage film 22 and a blocking insulating film 23.

The core portion 20a includes, for example, silicon oxide. The core portion 20a has, for example, a shape of circular pillar.

The semiconductor body 20b is provided around the core portion 20a. The semiconductor body 20b includes silicon, for example, polysilicon formed of the crystallization of amorphous silicon. The semiconductor body 20b has, for example, a shape of circular cylinder having a bottom. A bottom end of the semiconductor body 20b is in contact with the substrate 10. A structure 20 having a columnar shape is configured by the core portion 20a and the semiconductor body 20b.

A plug 34 is provided on a top end of the core portion 20a. The plug 34 is located in the inter-layer insulating film 14, and is surrounded in the periphery thereof by the semiconductor body 20b. The plug 34 is, for example, formed of the same material as the material of the semiconductor body 20b.

The tunneling insulating film 21 is provided around the semiconductor body 20b. The tunneling insulating film 21 is, for example, a silicon oxide film of single layer or an ONO film in which a silicon oxide layer, a silicon nitride layer and a silicon oxide layer are stacked. The tunneling insulating film 21 has, for example, a shape of circular cylinder.

The charge storage film 22 is provided around the tunneling insulating film 21. The charge storage film 22 is a film for storing charge. For example, the charge storage film 22 is formed of material having electron trapping sites, for example, formed of silicon nitride ($Si_3N_4$). The charge storage film 22 has, for example, a shape of circular cylinder.

The blocking insulating film 23 is provided around the charge storage film 22. The blocking insulating film 23 is, for example, formed of silicon oxide. The blocking insulator film 23 may be a multilayer film including a silicon oxide layer and an aluminum oxide layer, the aluminum oxide layer is made of aluminum oxide ($Al_2O_3$) and provided between the silicon oxide layer and the electrode film 17.

The tunneling insulating film 21, the charge storage film 22 and the blocking insulating film 23 configure a memory film 24 capable of storing charge. Therefore, the memory film 24 is disposed between the semiconductor body 20b and the electrode film 17.

A plug 30 is provided in a region directly above the columnar portion 25. The plug 30 extends in the Z-direction and pierces an insulating film 11 and an insulating film 12. The plug 30 is, for example, formed of conductive material such as tungsten or the like. The insulating film 11 and the insulating film 12 are, for example, formed of silicon oxide. Bit lines 31 extending in the X-direction are provided on the insulating film 12. The bit line 31 is connected to the semiconductor body 20b in the columnar portion 25 via the plugs 30, 34.

As shown in FIG. 3, a portion of the stacked body 15 is divided in the Y-direction by a columnar member 40. As shown in FIG. 1, the columnar member 40 is provided between source electrodes 18 adjacent in the X-direction. The columnar member 40 will be described later in detail.

As shown in FIG. 4, the source electrode 18 is provided with a plurality on the substrate 10. The source electrode 18 is, for example, formed of metal material such as tungsten or molybdenum. The source electrode 18 may include a main portion formed of metal material and a peripheral portion such as a barrier metal layer or the like which covers a surface of the main portion. For example, the barrier metal layer is made of titanium nitride (TiN) and covers side and bottom surfaces of the main portion.

The plurality of source electrodes 18 is separately arranged side by side along the X-direction with a constant distance, and extends in the Y-direction. For example, the source electrode 18 is provided such that the width in the X-direction at a top end is the same as the width in the X-direction at a bottom end. The source electrode 18 may be provided such that the thickness of the cross-section in the X-direction becomes the minimum at the bottom end, and increases at an upper level, resulting in the maximum thickness at the top end.

In each of portions between two source electrodes 18 adjacent in the X-direction, the stacked body 15, the inter-layer insulating film 14 and the insulating film 11 is provided in this order upward from the bottom. The insulating film 11, the inter-layer insulating film 14 and the stacked body 15 are divided by the source electrodes 18, and extend in the Y-direction. Therefore, the insulating film 16 and the electrode film 17 also extend in the Y-direction.

An insulating side wall 19 is provided between the source electrode 18 and a structure made of the stacked body 15, the inter-layer insulating film 14 and the insulating film 11. The electrode film 17 is isolated from the source electrode 18 by the side wall 19. The side wall 19 also extends in the Y-direction. The side wall 19 is, for example, formed of silicon oxide.

Hereinafter, the contact region Rc is described below.

In the contact region Rc, a shape of an end portion of the stacked body 15 is a staircase shape, and a step 17s is formed for each of the electrode films 17. An insulating film 13 covers the end portion of the stacked body 15 having the staircase shape, and a top surface of the insulating film 13 is flat. The insulating film 13 is, for example, formed of silicon oxide.

Contacts 32 are provided on each of steps 17s in each of stacked bodies 15. Each of the contacts 32 extends in the Z-direction and pierces the insulating film 13. A bottom end of the contact 32 is connected to the electrode film 17. In the embodiment, although two contacts 32 are connected to each of the electrode films 17, the number of the contacts 32 connected to each electrode film 17 is arbitrary.

A plurality of upper layer word lines 33 is provided on the insulating film 13, and extends the Y-direction. A top end of the contact 32 is connected to the upper layer word line 33. Thus, each of the electrode films 17 is connected to one upper layer word line 33 via the contact 32.

Here, in FIG. 2, for convenience in illustration, although a plurality of contacts 32 is illustrated in the same Y-Z plane, in practice, the plurality of contacts 32 connected to a different electrode film 17 is disposed at the different positions in the X-direction from each other. Thus, the one upper layer word line 33 shown in FIG. 2 is connected to only one electrode film 17 via the contact 32.

In the memory cell region Rm, the columnar portion 25 is connected between the substrate 10 and the bit line 31. Further, in each of the electrode films 17, a plurality of blocks is disposed in X-Y plane, and a part of a interconnect pattern is formed. Further, each of the blocks corresponds to a portion of the electrode film 17 between the source electrodes 18 adjacent, and forms a word line as control gate. For example, in each of the blocks, a row of the columnar portions 25 including the plurality of columnar portions 25 arranged in a predetermined direction is disposed.

Each of bit lines 31 extends in the X-direction over the plurality of blocks, and is connected to one columnar portion 25 in each of the blocks. Further, the memory cell including the memory film 24 is formed in each of portions where the semiconductor bodies 20b and the electrode films 17 cross each other.

In the memory cell region Rm, a plurality of memory cells is arranged in three-dimensional matrix manner along the X-direction, the Y-direction and the Z-direction, and each of the memory cells is capable of storing data. On the other hand, in the contact region Rc, each of the electrode films 17 is led from the memory cell region Rm, and connected to a peripheral circuit (not shown) via the contact 32 and the upper layer word line 33.

Hereinafter, the columnar member 40 is described.

Figure 5:
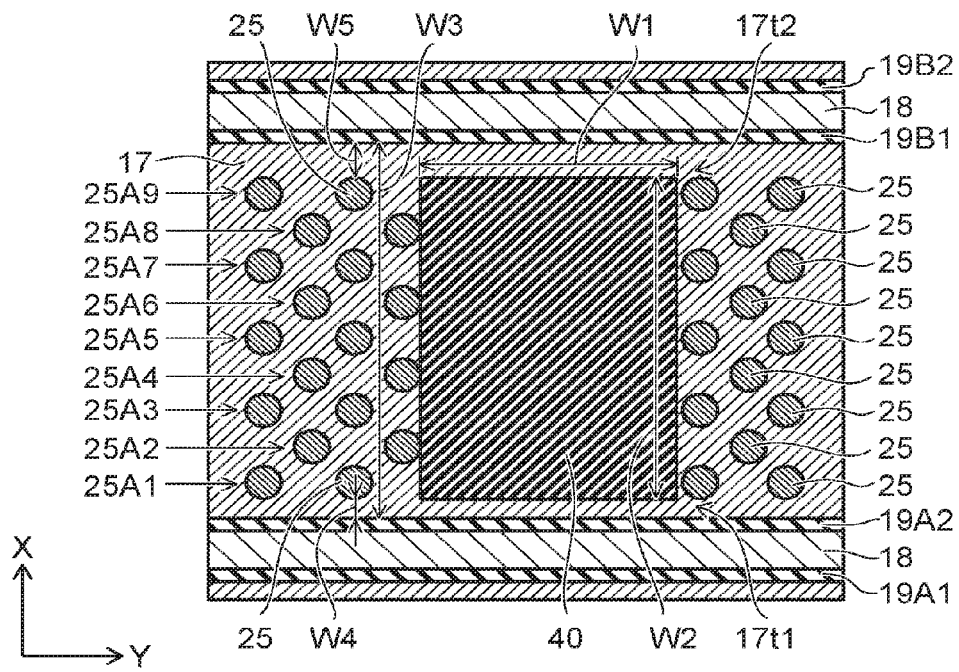
FIG. 5 is a cross-sectional view showing a part of the semiconductor memory device according to the first embodiment.

FIG. 5 is a cross-sectional view showing a part of the semiconductor memory device according to the first embodiment.

Figure 6:
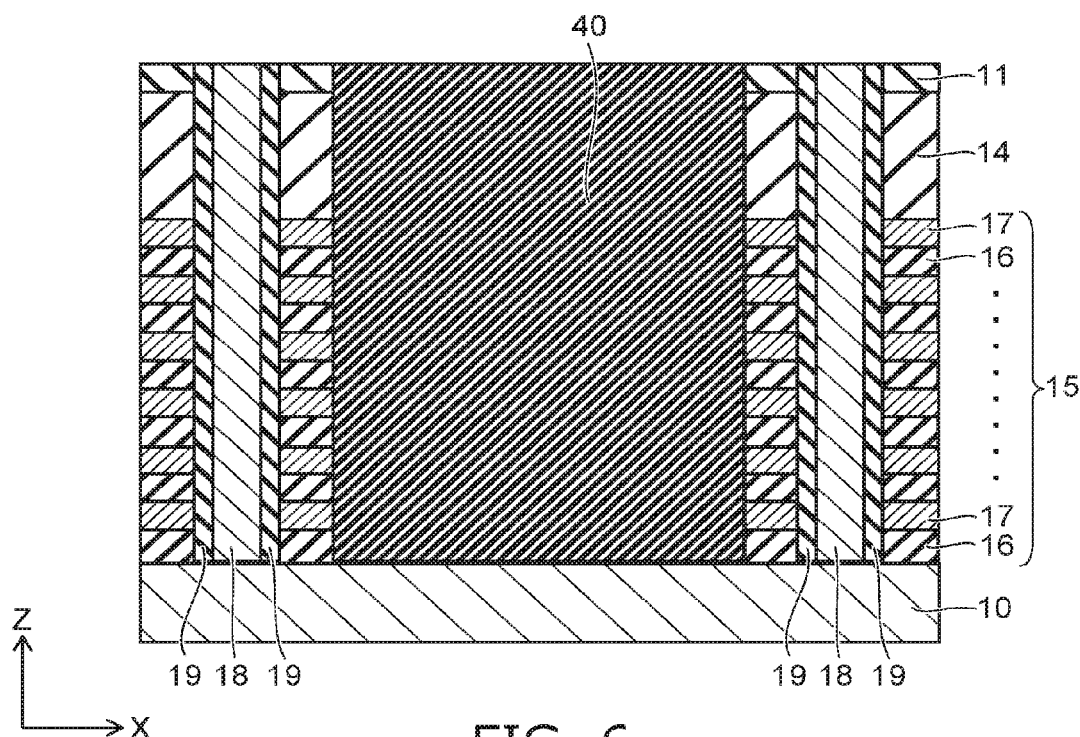
FIG. 6 is a cross-sectional view showing a part of the semiconductor memory device according to the first embodiment.

FIG. 6 is a cross-sectional view showing a part of the semiconductor memory device according to the first embodiment.

Figure 7:
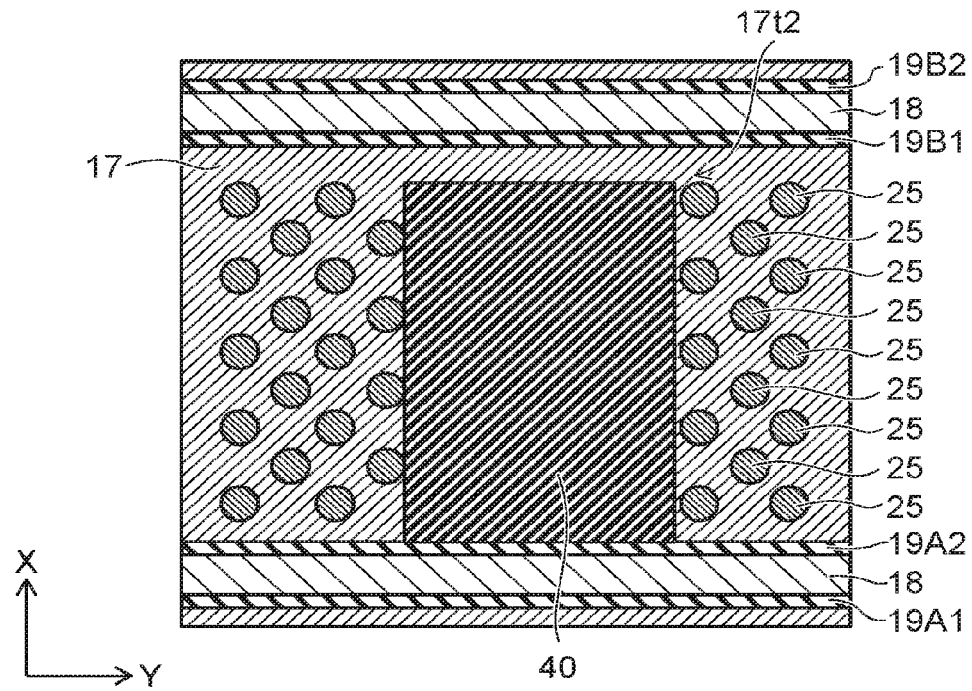
FIG. 7 is a cross-sectional view showing a part of another semiconductor memory device according to the first embodiment.
Figure 8:
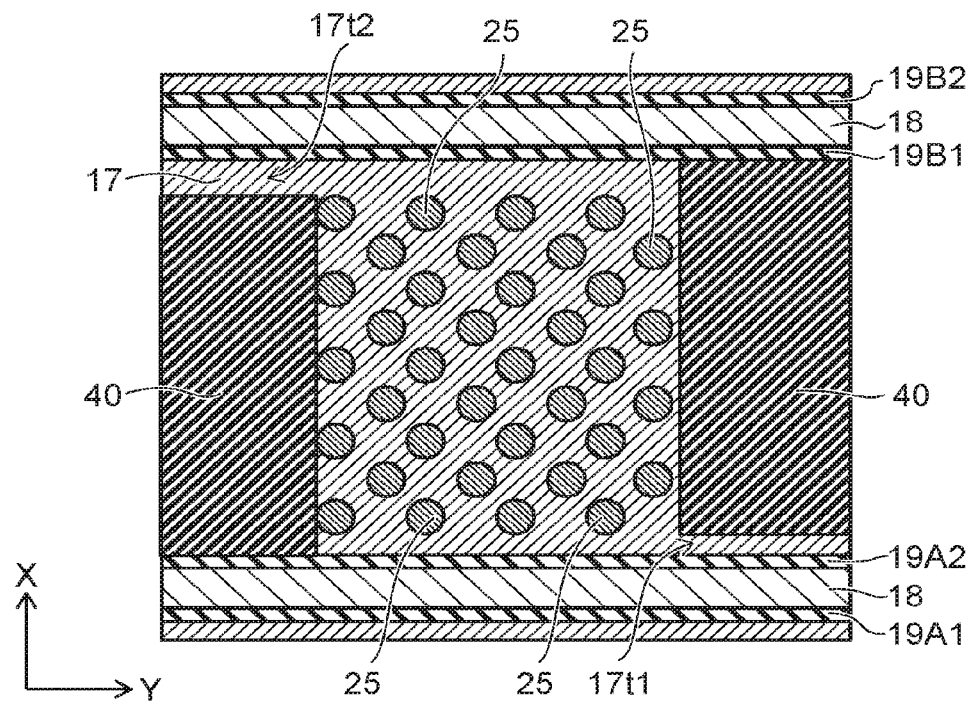
FIG. 8 is a cross-sectional view showing a part of another semiconductor memory device according to the first embodiment.
Figure 9:
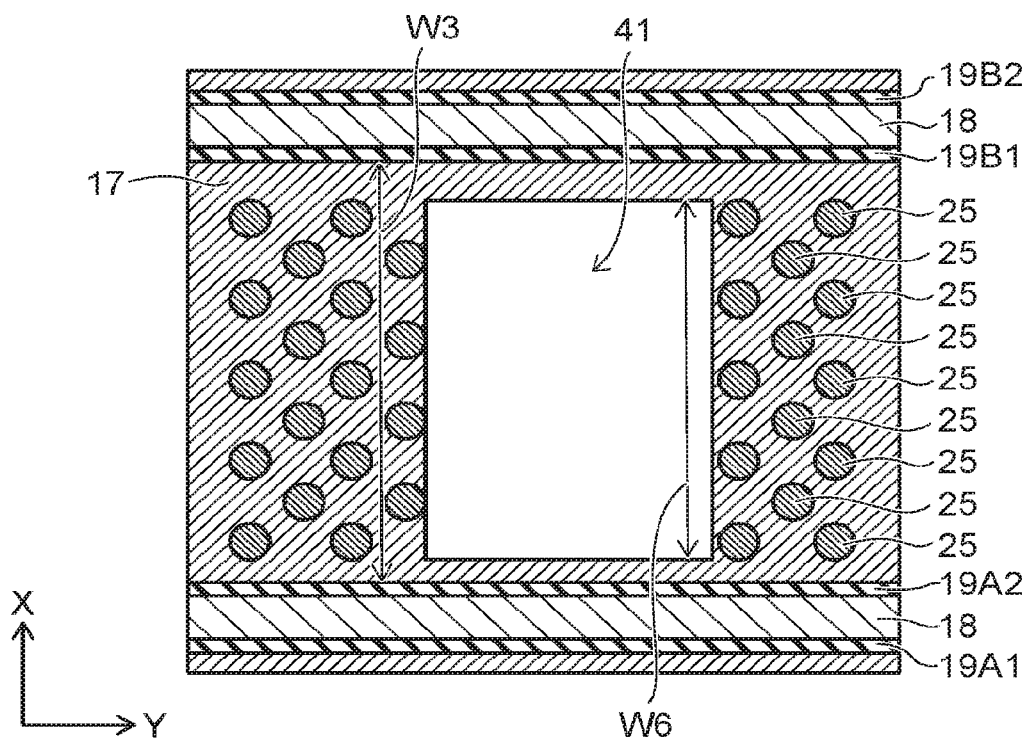
FIG. 9 is a cross-sectional view showing a part of another semiconductor memory device according to the first embodiment.

FIG. 7 to FIG. 9 are cross-sectional views showing parts of another semiconductor memory device according to the first embodiment.

FIG. 5 is a cross-sectional view of a region C of FIG. 1, and shows an enlarge view of the electrode film 17. FIG. 6 shows the X-Z cross-sectional view of the columnar member 40 in the region C of FIG. 1. FIG. 7 and FIG. 8 are views showing variations of the columnar member 40. FIG. 9 is a view showing a variation relating the columnar member 40. Each of cross-sections of FIG. 7 to FIG. 9 corresponds to a cross-section of FIG. 5.

As shown in FIG. 5 and FIG. 6, the columnar member 40 pierces the insulating film 11, the inter-layer insulating film 14 and the stacked body 15. A bottom end of the columnar member 40 is in contact with the substrate 10. The columnar member 40 is an insulating member having compressive stress. For example, the columnar member 40 includes silicon oxide ($SiO_2$) or silicon nitride (SiN). Here, the "member having compressive stress" refers to a member that a lattice constant is smaller than the original lattice constant. The lattice constant of the member having compressive stress is measured using XRD (X-Ray diffraction) method or electron beam diffraction method or the like.

The columnar member 40 divides a portion of the electrode film 17 provided in the memory cell region Rm and extending in the Y-direction. Here, as described later, because of forming a current path at both ends (end portions 17t1, 17t2) of the electrode film 17, the electrode film 17 extending in the Y-direction is not completely divided by the columnar member 40.

The columnar member 40 divides a row of the columnar portions 25 disposed in each of the electrode films 17. For example, in the case where the columnar portions 25 of each row are disposed along the Y-direction, and the number of the rows of the columnar portions 25 is nine, each of the rows 25A1 to 25A9 is divided in the Y-direction.

Here, the number of the rows of the columnar portion 25 is not limited to nine, and the rows of the columnar portion 25 may be provided any number. Further, all of the columnar portions 25 disposed in the rows 25A1 to 25A9 may not contribute to memory operation. For example, the columnar portions 25 disposed in the row 25A5 may be a dummy portion which does not contribute to memory operation. In this case, the columnar portions 25 disposed in the rows 25A1 to 25A4 and the columnar portions 25 disposed in the rows 25A6 to 25A9 are divided in the X-direction, for example, are disposed in staggered arrangement, respectively. In the dummy portion, the structure 20 and memory film 24 may be buried, and an insulating film and so on may be buried. In the case of dividing, in the X-direction, the columnar portions 25 disposed in the rows 25A1 to 25A4 and the columnar portions 25 disposed in the rows 25A6 to 25A9, it may be divided by an insulating film extending in the Y-direction.

For example, as shown in FIG. 5 and FIG. 6, a shape of the columnar member 40 is a rectangular shape when viewed in the X-Y plane and in the X-Z cross-section. Further, as shown in FIG. 3, the columnar member 40 has a rectangular shape when viewed in the Y-Z cross-section. Thus, the shape of the columnar member 40 is a rectangular parallelepiped. The shape of the columnar member 40 may not be limited to the rectangular parallelepiped, and may be various shapes capable of dividing a portion of the electrode film 17 and the row of the columnar portions 25. For example, the shape of the columnar member 40 may be a circular column or an elliptic column.

In the case where the shape of the columnar member 40 is the rectangular parallelepiped, a width W1 of the columnar member 40 in the Y-direction is, for example, about several hundred nanometers. In this case, a width of the memory cell region Rm in the Y-direction is about 5 mm. A width W2 of the columnar member 40 in the X-direction is smaller than a width W3 of the electrode film 17 in the X-direction. Further, in order to form the current path at both ends of the electrode film 17, when widths of the end portions 17t1 and 17t2 of the electrode film 17 are W4 and W5, respectively, the width W2 is set so as to satisfy the following expression (1)

$$W3-W4-W5 \geq W2 \qquad (1)$$

The end portion 17t1 corresponds to a portion of the electrode film 17 between the columnar portions 25 disposed in the row 25A1 and the side wall 19A2. The end portion 17t2 corresponds to a portion of the electrode film 17 between the columnar portions 25 disposed in the row 25A9 and the side wall 19B1. The end portions 17t1, 17t2 are conduction portions and form the word line. The columnar member 40 is not disposed in the end portions 17t1, 17t2.

Here, one of the end portions 17t1, 17t2 may be formed in the electrode film 17. For example, as shown in FIG. 7, the end portion 17t2 of the electrode film 17 is formed, and the columnar member 40 may be disposed to be contact with the side wall 19A2.

As described above, the columnar member 40 divides a portion of the stacked body 15 in the Y-direction, and is provided between the source electrodes 18 adjacent in the X-direction. At least one of the columnar members 40 is provided between the adjacent source electrodes 18. In the case where the plurality of columnar members 40 is provided to be disposed in the Y-direction, distances between the columnar members 40 adjacent in the Y-direction may be constant. In this case, the plurality of columnar members 40 is periodically disposed in the Y-direction. The distances between the columnar members 40 adjacent in the Y-direction may be different each other.

Further, in the case where the plurality of columnar members 40 is provided to be disposed in the Y-direction, the columnar members 40 may be disposed such that the end portions 17t1, 17t2 are alternately formed in the electrode films 17. For example, as shown in FIG. 8, two columnar members 40 are disposed such that the end portions 17t1, 17t2 are alternately formed in the electrode films 17. In this case, one columnar member 40 is disposed to be in contact with the side wall 19A2, and another columnar member 40 is disposed to be in contact with the side wall 19B1.

The columnar member 40 may be provided in a shunt portion of the stacked body 15. The shunt portion means a region in the stacked body 15, and the region where the columnar portion 25 corresponding to the dummy portion is provided. If the columnar member 40 is provided in the shunt portion of the stacked body 15, a reducing of a density of the memory cells formed can be suppressed.

Further, a portion of the stacked body 15 may be not divided by providing the columnar member 40. For example, as shown in FIG. 9, a gap 41 dividing a portion of the electrode film 17 may be formed. The gap 41 divides the rows of the columnar portions 25 disposed in each of the electrode films 17. The gap 41 pierces the insulating film 11, the inter-layer insulating film 14 and the stacked body 15. A width W6 of the gap 41 in the X-direction is smaller than the width W3 of the electrode film 17 in the X-direction. Further, a portion of the stacked body 15 may be divided by the columnar member 40 and the gap 41.

Hereinafter, the manufacturing method of the semiconductor memory device according to the embodiment is described.

FIG. 10A and FIG. 10B to FIG. 14A and FIG. 14B are views showing a manufacturing method of the semiconductor memory device according to the first embodiment.

FIG. 10A, FIG. 11A, FIG. 12A, FIG. 13A and FIG. 14A show plane views showing the manufacturing method of the semiconductor memory device 1. FIG. 10B, FIG. 11B, FIG. 12B, FIG. 13B and FIG. 14B show cross-sectional views showing the manufacturing method of the semiconductor memory device 1. Planes of FIG. 10A to FIG. 14A correspond to a plane of the region C of FIG. 1. FIG. 10B to FIG. 12B correspond to a cross-section of FIG. 4, and cross-sections of FIG. 13B and FIG. 14B correspond to a cross-section of FIG. 6. Here, hereinafter, the manufacturing method of the memory cell region Rm of the semiconductor memory device 1 is described.

First, the stacked body 15a is formed on the substrate 10 being a portion of a wafer by alternately stacking the insulating film 16 and a sacrifice film 50 along the Z-direction using, for example, a CVD (Chemical Vapor Deposition) method. The insulating film 16 is, for example, formed of silicon oxide. The sacrifice film 50 is formed of material capable of taking an etching selection ratio to the insulating film 16, for example, is formed of silicon nitride. Subsequently, the inter-layer insulating film 14 is formed on the stacked body 15a.

Figure 10A:
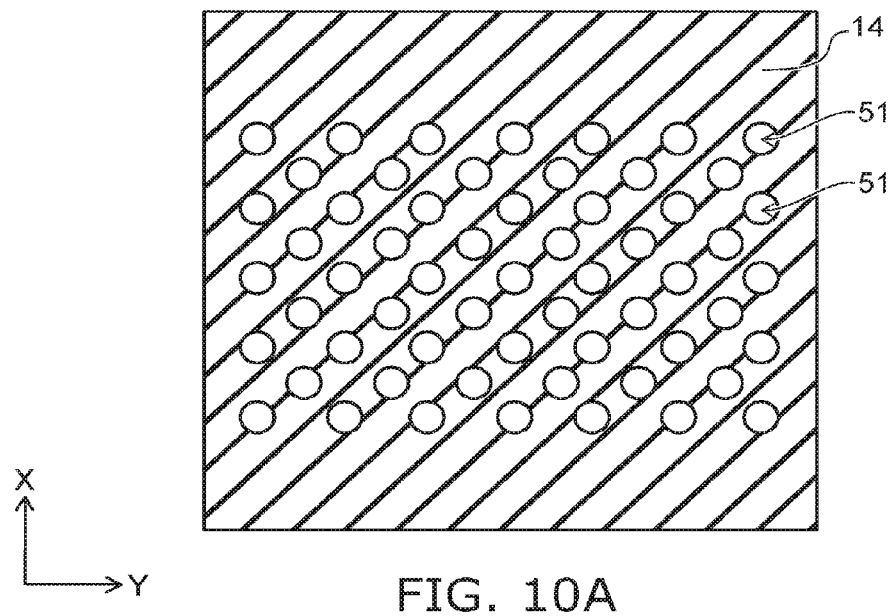
Figure 10B:
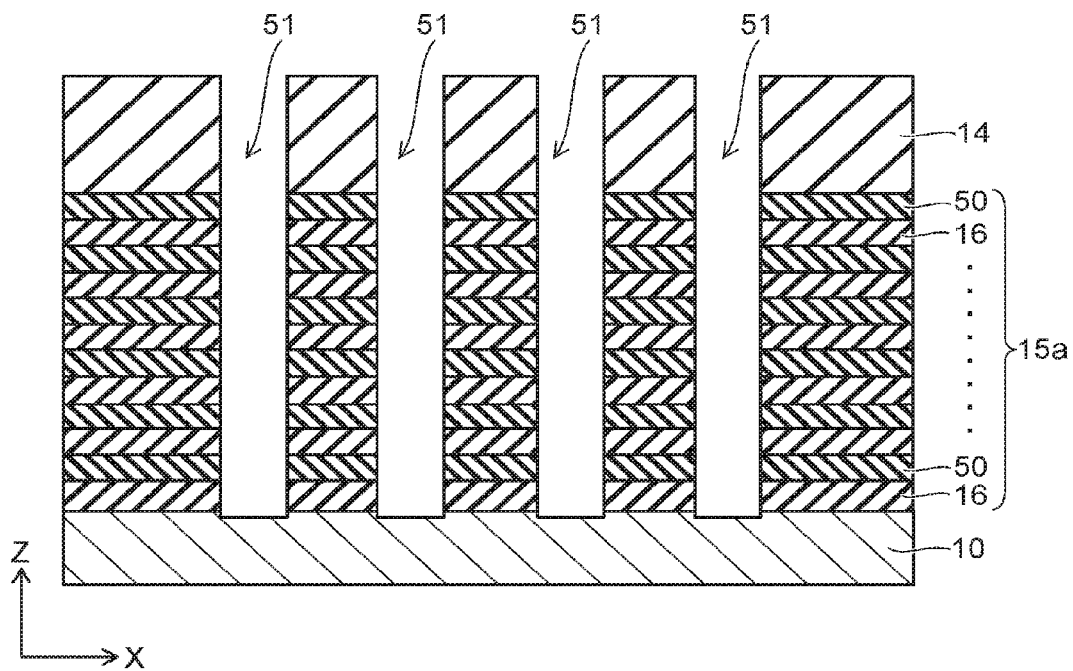

Next, as shown in FIG. 10A and FIG. 10B, for example, a plurality of memory holes 51 (through holes) is formed in the inter-layer insulating film 14 and the stacked body 15a by, for example, RIE (Reactive Ion Etching). The memory hole 51 extends in the Z-direction, pierces the inter-layer insulating film 14 and the stacked body 15a, and reaches the substrate 10. When viewed from the Z-direction, a shape of the memory hole 51 is a circular shape. Further, when viewed from the Z-direction, the memory holes 51 are, for example, disposed in the staggered arrangement.

Figure 11A:
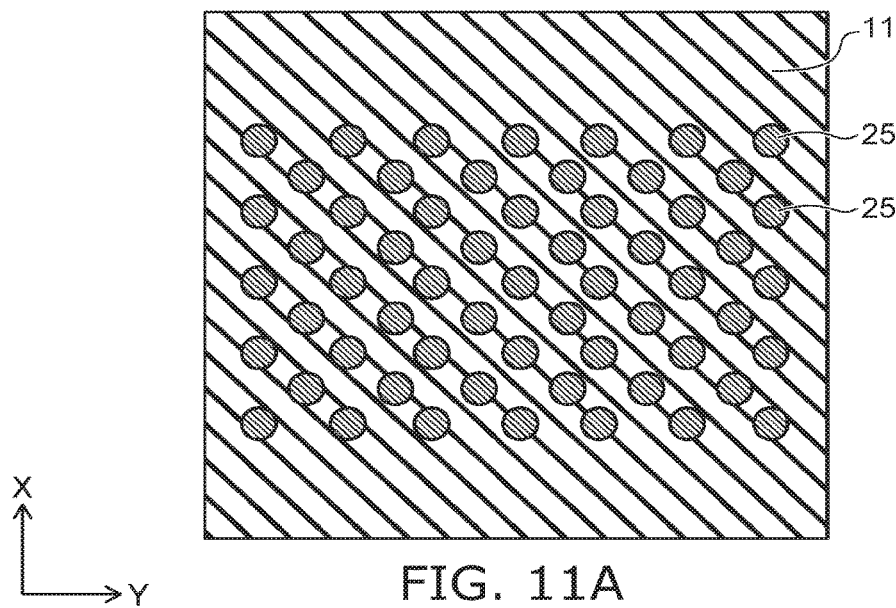
Figure 11B:
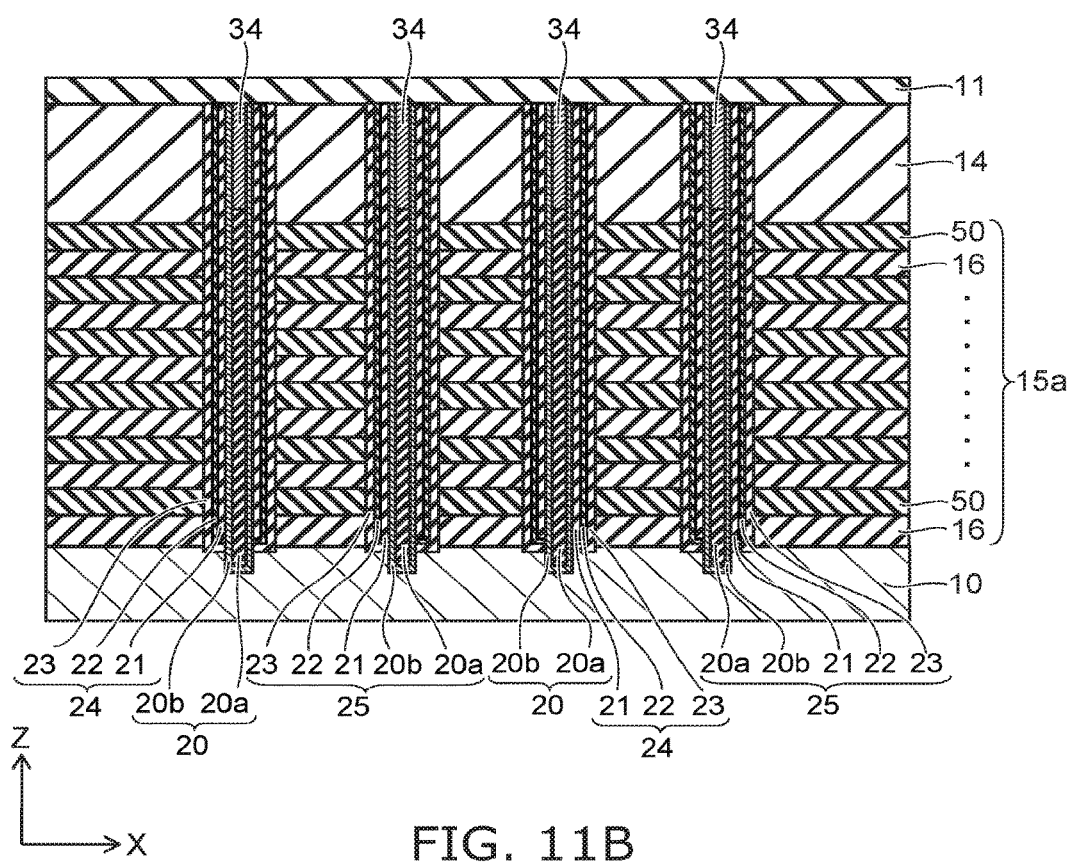

Next, as shown in FIG. 11A and FIG. 11B, by, for example, a CVD method, the blocking insulating film 23 is formed by depositing silicon oxide on an inner surface of the memory hole 51, the charge storage film 22 is formed by depositing silicon nitride, and the tunneling insulating film 21 is formed by depositing silicon oxide. Thereafter, by performing RIE, the tunneling insulating film 21, the charge storage film 22 and the blocking insulating film 23 are removed from a bottom surface of the memory hole 51 so as to expose the substrate 10. Subsequently, the semiconductor body 20b is formed by depositing silicon, and the core portion 20a is formed by depositing silicon oxide. The semiconductor body 20b is in contact with the substrate 10. Thus, the columnar portion 25 including the structure 20 and the memory film 24 is formed in the memory hole 51. Thereafter, the plug 34 is formed so as to remove an upper portion of the core portion 20a by performing etching-back and bury silicon into which an impurity is introduced. Subsequently, the insulating film 11 is formed on the inter-layer insulating film 14.

Figure 12A:
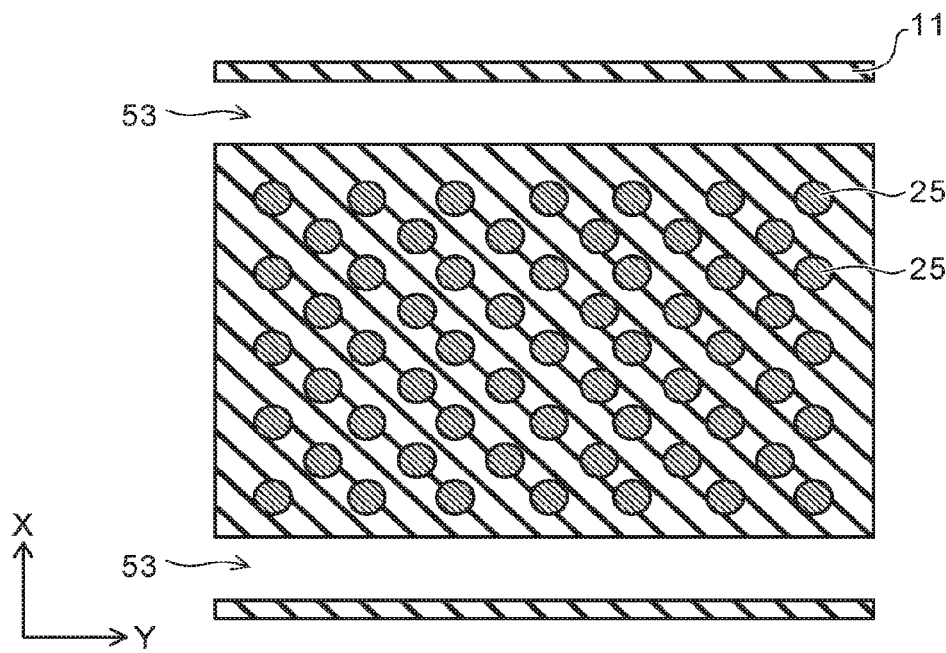
Figure 12B:
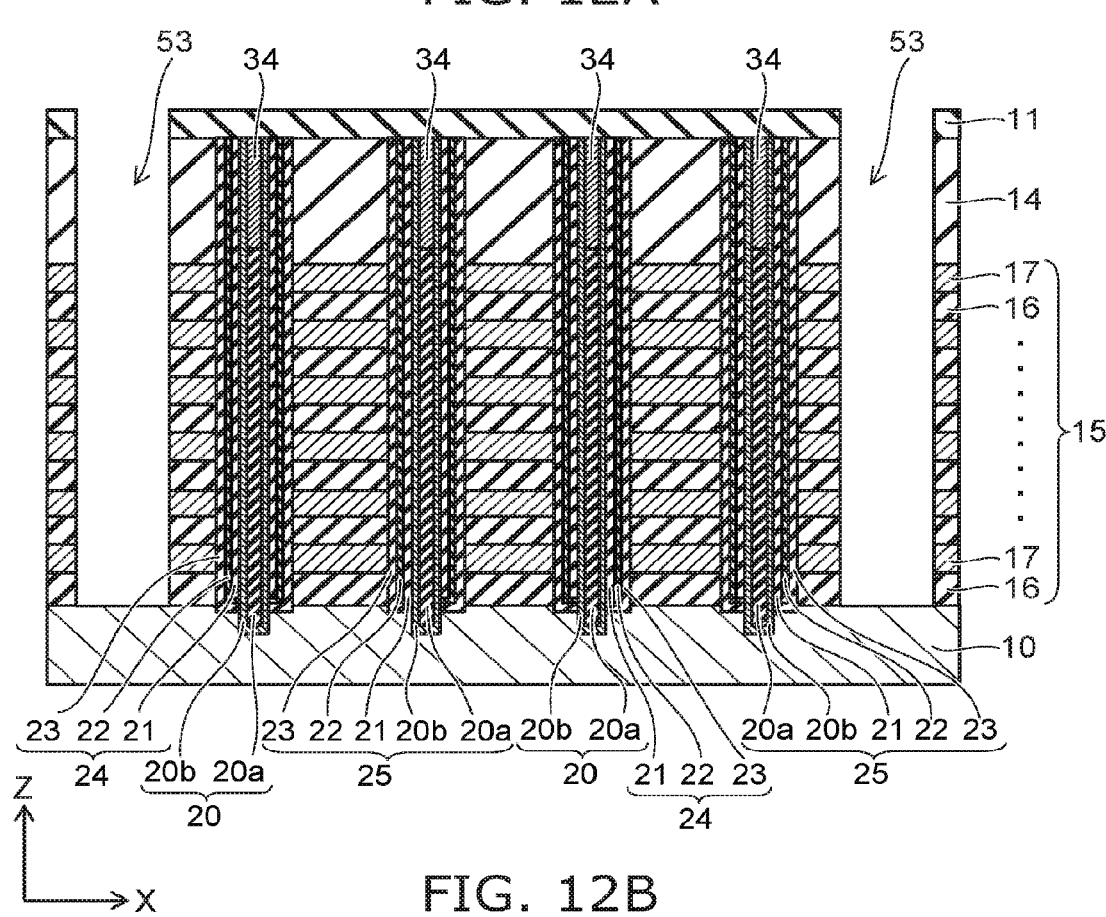

Next, as shown in FIG. 12A and FIG. 12B, by, for example, anisotropic etching such as RIE, a plurality of slits 53 extending in the Y-direction is formed in the stacked body 15a, the inter-layer insulating film 14 and the insulating film 11. The slit 53 pierces the stacked body 15a, the inter-layer insulating film 14 and the insulating film 11. Thus, the stacked body 15a is divided into a plurality of stacked bodies extending in the Y-direction, by the slits 53. Subsequently, by performing wet etching via the slit 53, the sacrifice film 50 is removed. By removing the sacrifice film 50 via the slit 53, a cavity is formed. Thereafter, the electrode film 17 is formed such that a conductive film such as tungsten or molybdenum is deposited to be buried in the cavity. The stacked body 15 is formed between the slits 53 by replacing the sacrifice film 50 with the electrode film 17.

Figure 13A:
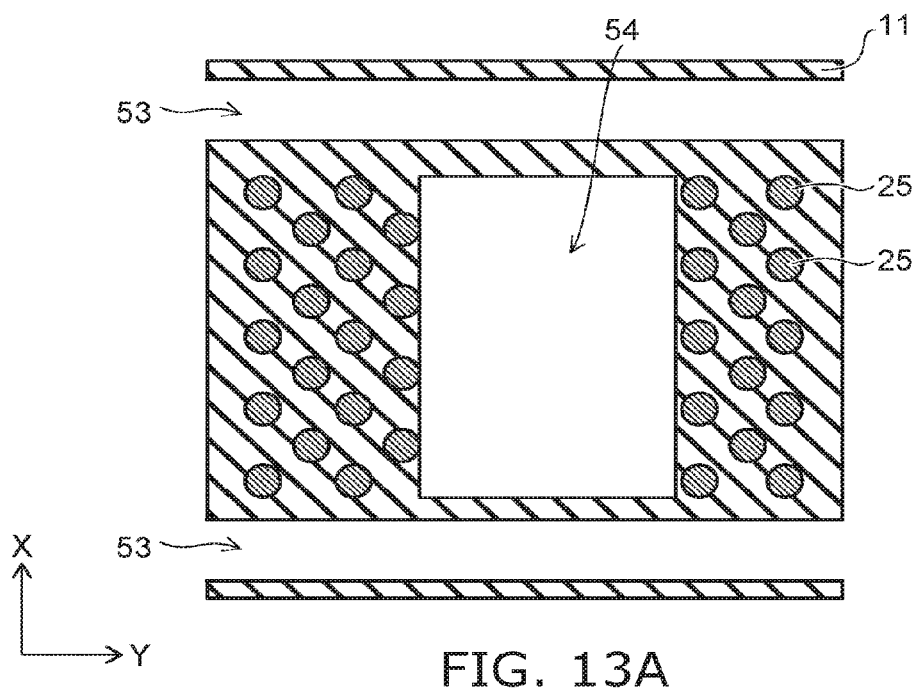
Figure 13B:
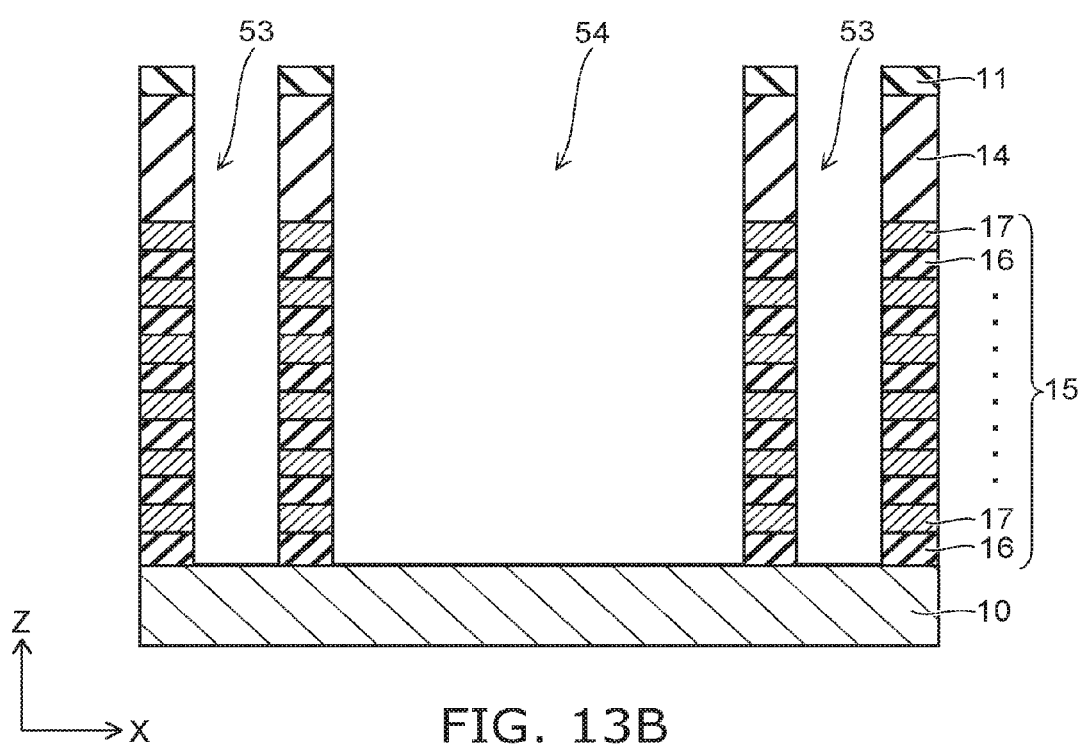

Next, as shown in FIG. 13A and FIG. 13B, a hole 54 is formed by removing a portion of the stacked body 15, a portion of the inter-layer insulating film 14, and a portion of the insulating film 11. By the hole 54, the columnar portion 25 locating in the removed portion of the stacked body 15 is removed. The hole 54 is formed between the slits 53 adjacent in the X-direction. The hole 54 is formed by, for example, RIE after alignment using photolithography. A portion of the electrode film 17 is divided by the hole 54. Further, the hole 54 divides the rows of the columnar portions 25 disposed each of the electrode films 17.

Figure 14A:
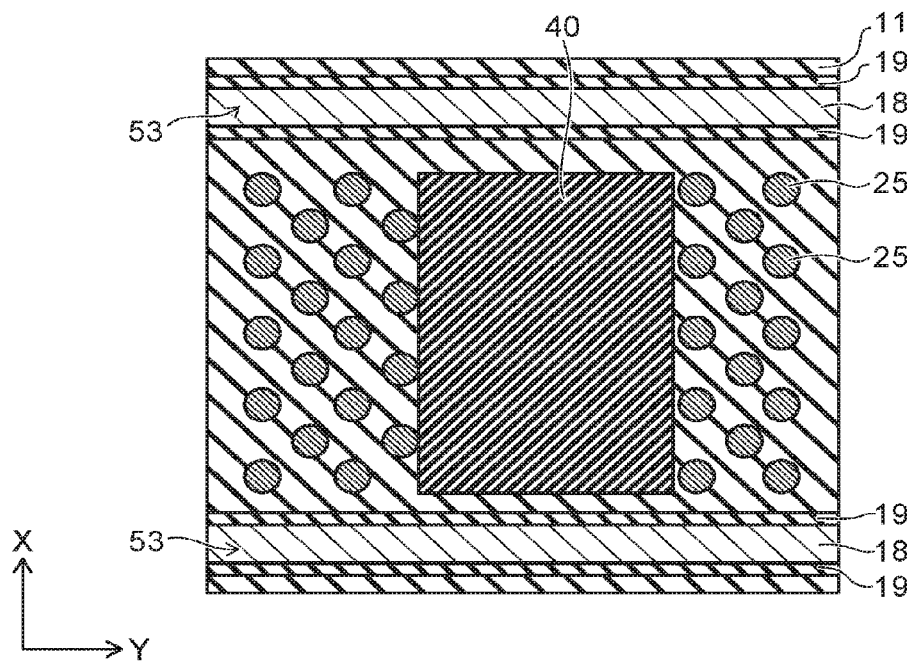
Figure 14B:
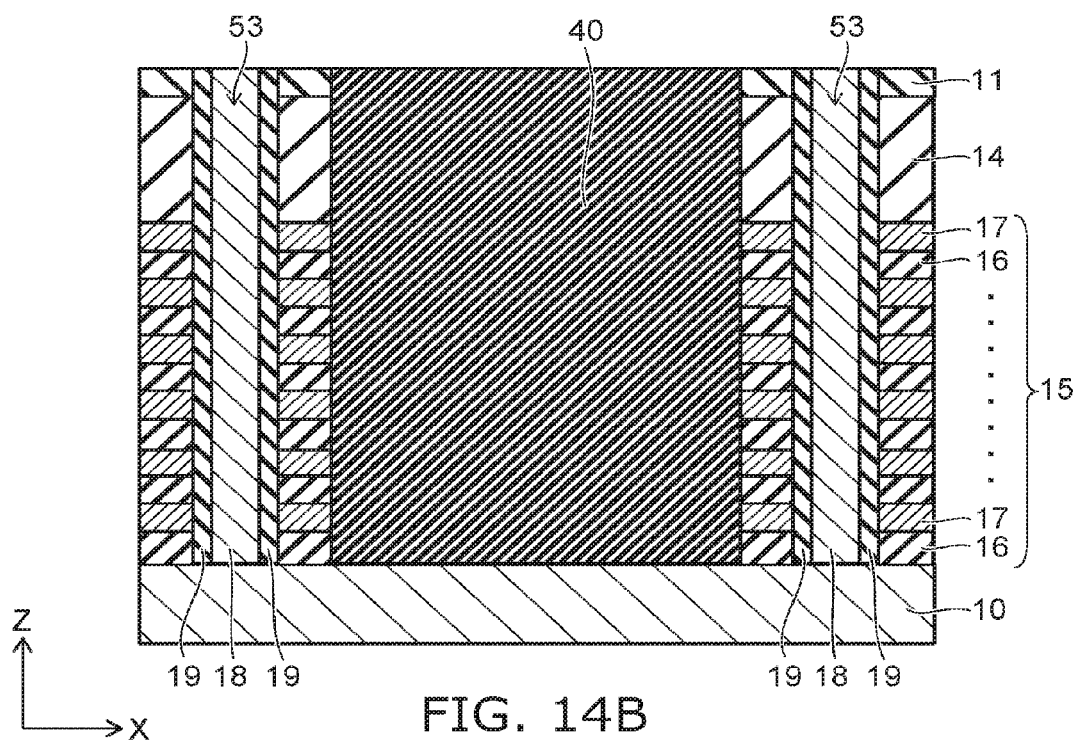

Next, as shown in FIG. 14A and FIG. 14B, an insulating member having compressive stress is formed in the hole 54. An insulating film is formed by depositing silicon oxide in the hole 54 using, for example, a CVD method. Here, when depositing silicon oxide in the hole 54 by the CVD method, silicon oxide is prevented from depositing in the slit 53 by a mask and so on. Thus, the columnar member 40 is formed. By the columnar member 40, a portion of the electrode film 17 extending in the Y-direction is divided, and the rows of the columnar portions 25 disposed in each of the electrode films 17 are divided. Subsequently, after forming an insulating film by depositing silicon oxide on a whole surface, the side wall 19 is formed by etching-back the insulating film and leaving the insulating film on a side surface of the slit 53. Subsequently, a conductive film is formed by depositing tungsten or molybdenum so as to be thick. Thus, the source electrode 18 is formed in the slit 53.

Thereafter, the plug 30 and the bit line 31 are formed, and a plurality of semiconductor memory devices 1 is divided by dicing the wafer.

In this manner, the semiconductor memory device 1 according to the embodiment is manufactured.

Hereinafter, an effect of the embodiment is described.

Figure 15:
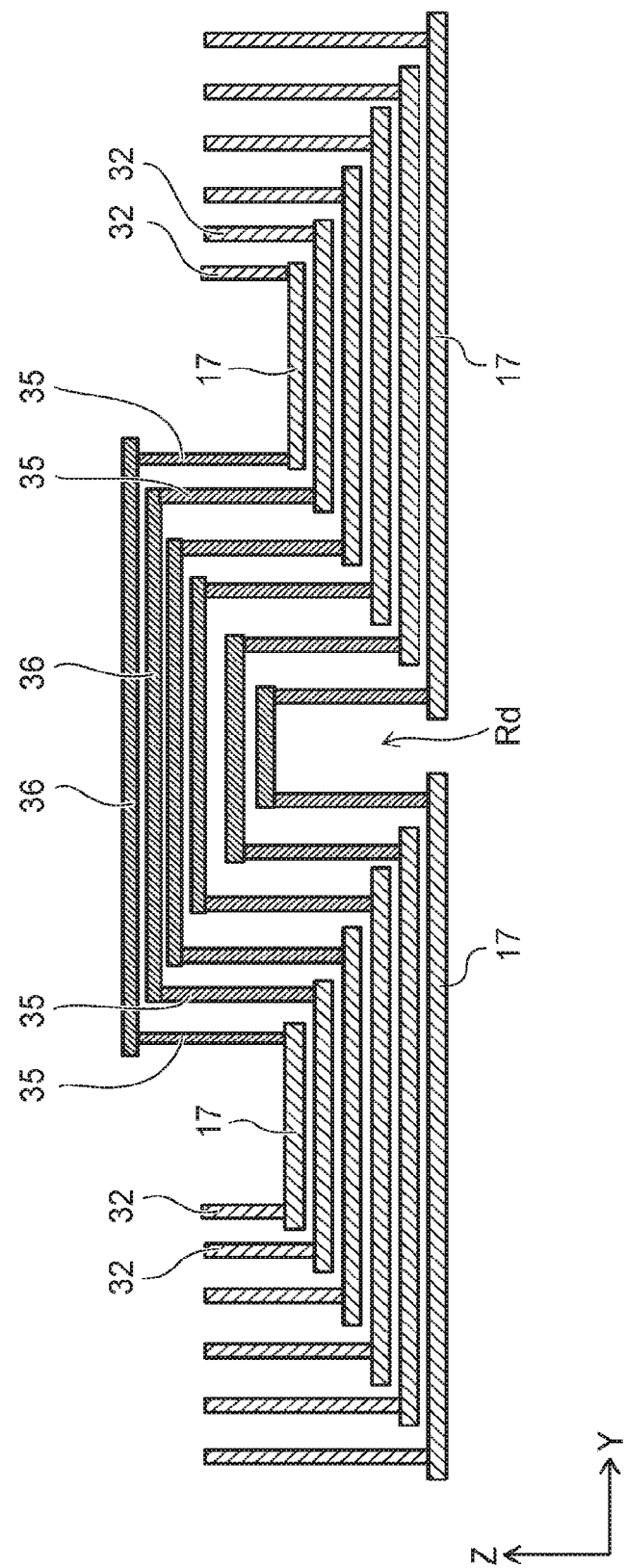
FIG. 15 is a reference view of a part of a semiconductor memory device.

FIG. 15 is a reference view of a part of the semiconductor memory device.

In the semiconductor memory device of the three-dimensional structure, by disposing a large number of the columnar portions in the electrode film, it is possible to drive a large number of memory cells. On the other hand, as the number of the columnar portions disposed in the electrode film is increased, the semiconductor memory device has a stacked structure that the electrode film is long in the Y-direction. Further, when the electrode film is formed of metal material, tensile stress is likely to occur in the Y-direction, and compressive stress is likely to occur in the X-direction. Therefore, such stress occurs on one side of the substrate, and the substrate has large warp.

Due to the difference in stress which occurs in the X-direction and the Y-direction, direction of the warp of the substrate differs between the X-direction and the Y-direction. Further, when the semiconductor memory device has a stacked structure that the electrode film is long in the Y-direction, the electrode film is not easily divided in the Y-direction and the warp of the substrate in the Y-direction is less likely to be reduced. Thus, stress is easily applied to the Y-direction, and the difference between the amount of warp in the X-direction of the substrate and the amount of warp in the Y-direction of the substrate is increased. Therefore, the warp of the substrate is increased.

Further, the plurality of semiconductor memory devices is manufactured by forming the structure on the wafer including the substrate, and dicing the wafer and the structure. Therefore, the warp of the substrate appears as the warp of the wafer before the dicing. The great warp of the wafer deteriorates the accuracy in the manufacturing process, and hinders the stable operation of the manufacturing device.

As the embodiment, when the columnar member 40 is provided in the stacked body 15, it is possible that the Y-direction component (tensile stress or the like) of the stress occurring in the electrode film 17 is divided. Further, when the columnar member 40 is formed of the insulating member having compressive stress, it is possible to relax the tensile stress occurring in the Y-direction in the electrode film 17. Thus, it is possible to reduce the difference between the amount of warp in the X-direction of the substrate 10 and the amount of warp in the Y-direction of the substrate 10. Therefore, since it is possible to reduce the stress occurring in each of the electrode films 17, it is possible to suppress the warpage of the substrate 10 and to suppress the warpage and cracking of the wafer.

Further, the columnar member 40 is not formed at the end portions 17*t*1, 17*t*2 of the electrode film 17. Thus, the word line is formed in the electrode film 17 so that a connecting path can be ensured.

Here, as shown in FIG. 15, in the case where the electrode film 17 is simply divided in the Y-direction, it is also imaginable that a dividing region Rd is set, and that an end portion of the stacked body 15 is processed in a staircase shape. In this case, adjacent electrode films 17 are electrically connected by forming a contact 35 and an upper layer interconnect 36. However, in this case to form the dividing region Rd, a density of the memory cells formed is reduced in the whole device, by the memory cell being not formed in the dividing region Rd.

On the other hand, as the embodiment, when the columnar member 40 is provided in the region having the dummy portion of the columnar portion 25 such as the shunt portion, the reducing of the density of the memory cells formed can be suppressed.

Hereinafter, another manufacturing method of the semiconductor memory device according to the embodiment is described.

Figure 16:
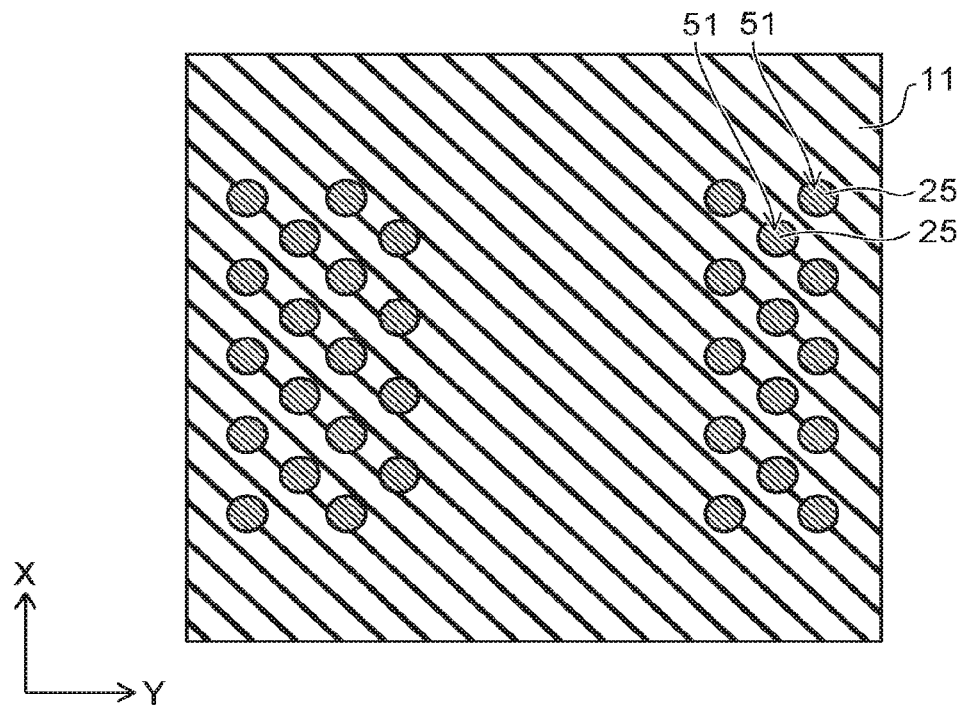
FIG. 16 to FIG. 18 are views showing another manufacturing method of the semiconductor memory device according to the first embodiment.
Figure 17:
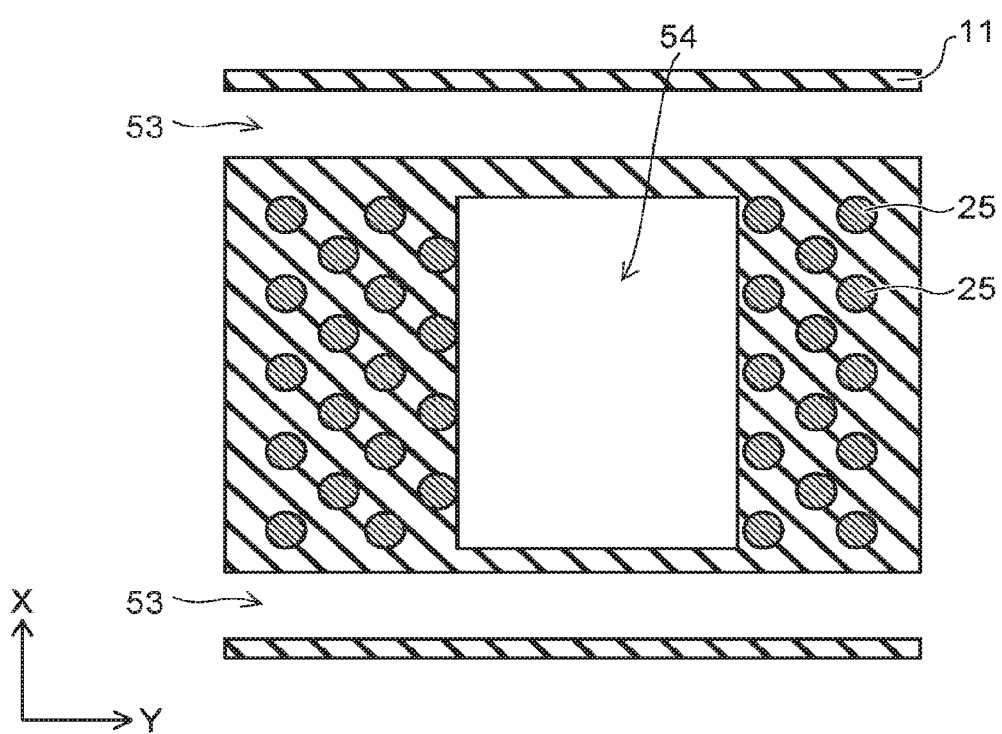
Figure 18:
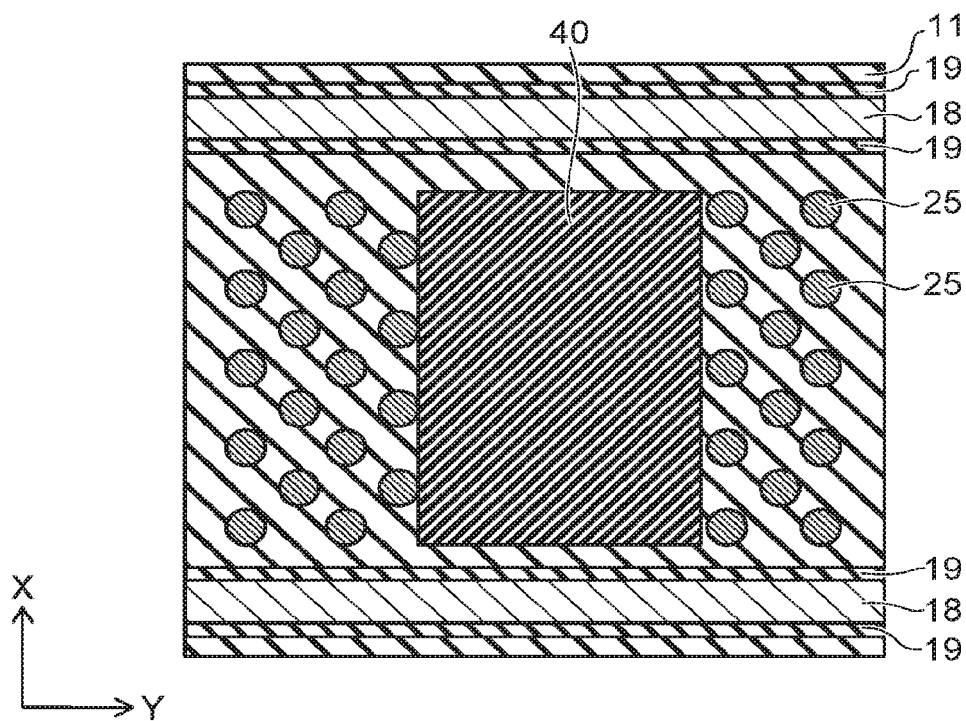

FIG. 16 to FIG. 18 are views showing another manufacturing method of the semiconductor memory device according to the first embodiment.

FIG. 16 to FIG. 18 show plane views showing the manufacturing method of the semiconductor memory device 1. Planes of FIG. 16 to FIG. 18 correspond to the plane of the region C of FIG. 1. Here, hereinafter, the manufacturing method of the memory cell region Rm of the semiconductor memory device 1 is described.

First, the stacked body 15*a* is formed on the substrate 10 being a portion of the wafer by alternately stacking the insulating film 16 and the sacrifice film 50 along the Z-direction using, for example, a CVD method. Subsequently, the inter-layer insulating film 14 is formed on the stacked body 15*a*.

Next, as shown in FIG. 16, by, for example, RIE, the plurality of memory holes 51 is formed in the inter-layer insulating film 14 and the stacked body 15*a*. The memory hole 51 extends in the Z-direction, pierces the inter-layer insulating film 14 and the stacked body 15*a*, and reaches the substrate 10. The memory hole 51 is not formed in a portion of the stacked body 15*a*. Subsequently, the blocking insulating film 23, the charge storage film 22, the tunneling insulating film 21, the semiconductor body 20*b* and the core portion 20*a* are formed in the memory hole 51. Thus, the columnar portion 25 including the structure 20 and the memory film 24 is formed. Subsequently, the insulating film 11 is formed on the inter-layer insulating film 14.

Next, as shown in FIG. 17, by, for example, anisotropic etching such as RIE, the plurality of slits 53 extending in the Y-direction is formed in the stacked body 15*a*, the inter-layer insulating film 14 and the insulating film 11. Subsequently, the hole 54 is formed by removing a portion of the stacked body 15*a*. Here, the slit 53 may be formed after forming the hole 54. Subsequently, after forming the cavity by removing the sacrifice film 50 via the slit 53, the electrode film 17 is formed by burying the conductive film in the cavity. Thus, the stacked body 15 is formed between the slits 53.

Next, as shown in FIG. 18, the insulating member having compressive stress is formed in the hole 54. Thus, the columnar member 40 dividing a portion of the electrode film 17 extending in the Y-direction is formed. Subsequently, the side wall 19 is formed on a side surface of the slit 53, and the conductive film is formed by depositing tungsten or molybdenum so as to be thick. Thus, the source electrode 18 is formed in the slit 53. Here, the columnar member 40 may be formed after forming the side wall 19 and the source electrode 18.

In the manufacturing method of the semiconductor memory device showed by FIG. 16 to FIG. 18, the columnar portion 25 is not formed in a region (a portion of the stacked body 15) where the columnar member 40 is formed. On the other hand, in the manufacturing method of the semiconductor memory device showed by FIG. 10A and FIG. 10B to FIG. 14A and FIG. 14B, after forming the columnar portion 25 in the region where the columnar member 40 is formed, the columnar member 40 is formed by removing the columnar portion 25.

Second Embodiment

Figure 19:
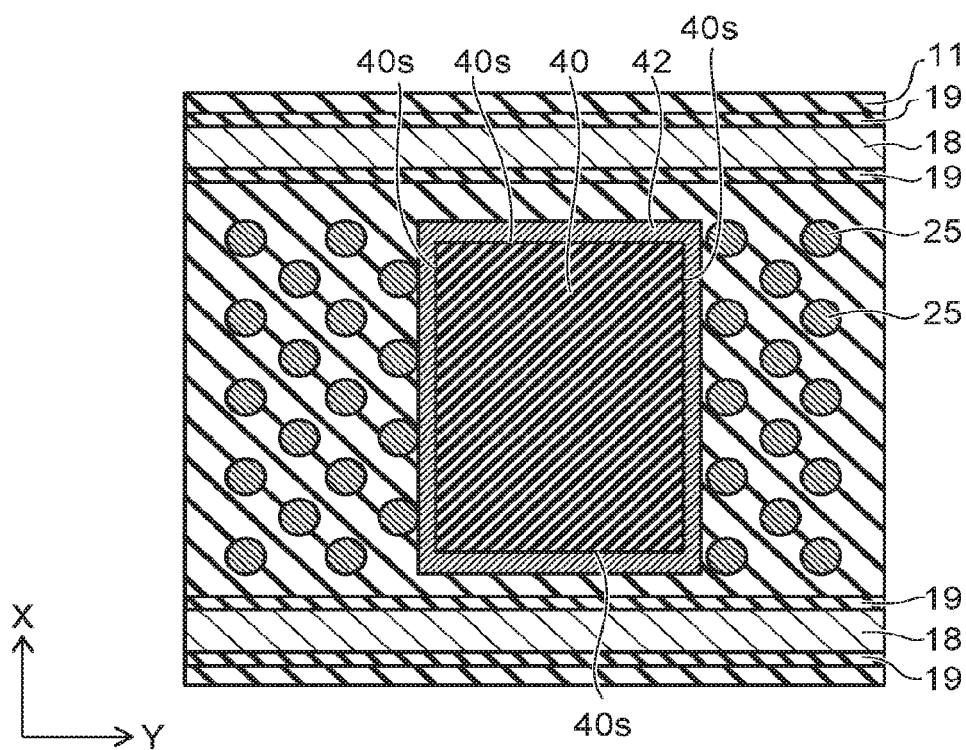
FIG. 19 is a plan view showing a part of a semiconductor memory device according to a second embodiment.

FIG. 19 is a plan view showing a portion of the semiconductor memory device according to the second embodiment.

Figure 20:
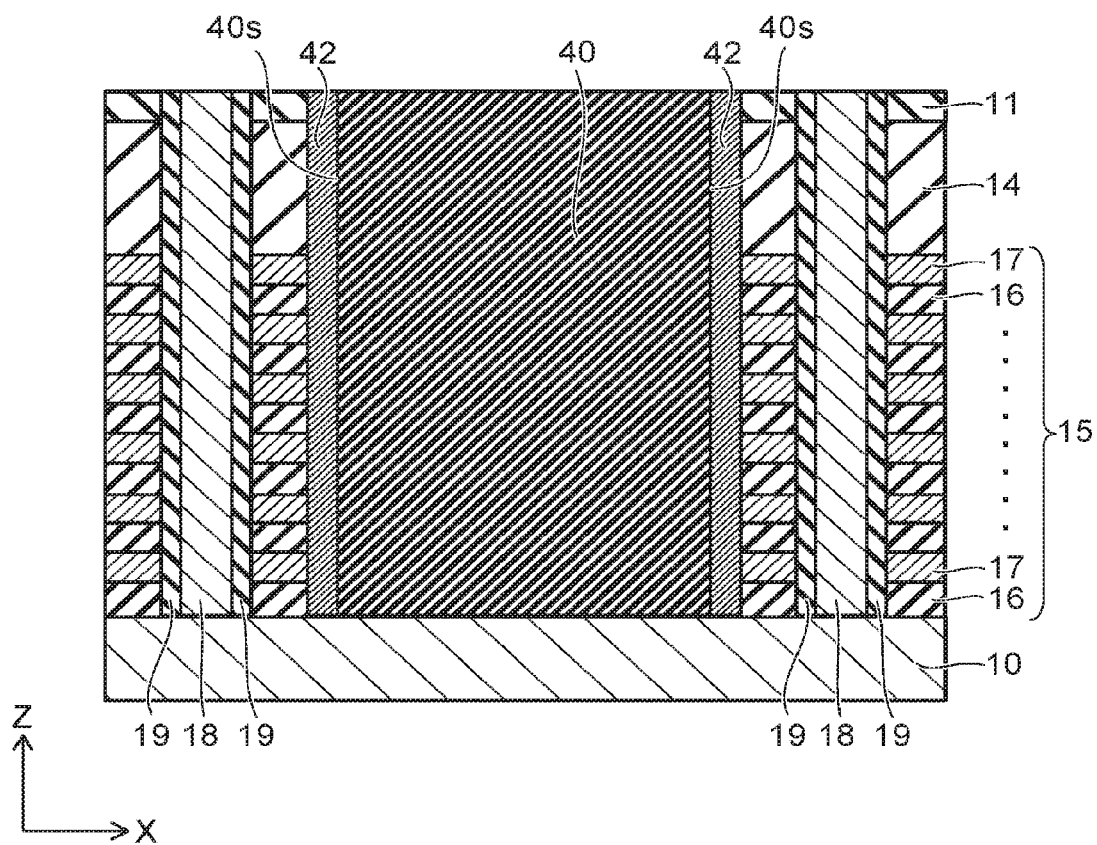
FIG. 20 is a cross-sectional view showing a part of the semiconductor memory device according to the second embodiment.

FIG. 20 is a cross-sectional view showing a portion of the semiconductor memory device according to the second embodiment.

A plane of FIG. 19 corresponds to the plane of the region C of FIG. 1. A cross-section of FIG. 20 corresponds to the cross-section of FIG. 6.

The second embodiment and the first embodiment differ in the enclosing portion 42. Since configurations other than the enclosing portion 42 of the second embodiment are the same as the first embodiment, the detailed description of other configurations is omitted.

As shown in FIG. 19 and FIG. 20, the columnar member 40 pierces the insulating film 11, the inter-layer insulating film 14 and the stacked body 15, and a bottom end of the columnar member 40 is in contact with the substrate 10. The columnar member 40 is the insulating member having compressive stress. A portion of the electrode film 17 extending in the Y-direction, and the rows of the columnar portions 25 disposed in each of the electrode films 17 are divided by the columnar member 40.

The enclosing portion 42 is provided around the columnar member 40, namely, on a side surface 40s thereof. The enclosing portion 42 is provided between the columnar member 40 and a structure including the stacked body 15, the inter-layer insulating film 14 and the insulating film 11. The enclosing portion 42 covers the side surface 40s of the columnar member 40. The enclosing portion 42 is formed of the same material as a portion of the columnar portion 25. For example, the enclosing portion 42 is formed of at least one portion of a material forming the structure 20 (the core portion 20a and the semiconductor body 20b) and a material forming the memory film 24 (the tunneling insulating film 21, the charge storage film 22 and the blocking insulating film 23).

Hereinafter, the manufacturing method of the semiconductor memory device according to the embodiment is described.

FIG. 21A and FIG. 21B to FIG. 24A and FIG. 24B are views showing a manufacturing method of the semiconductor memory device according to the second embodiment.

The manufacturing method of the semiconductor memory device of the second embodiment is different from the manufacturing method of the semiconductor memory device of the first embodiment in the forming method of the enclosing portion 42. Thus, in processes shown in FIG. 10A and FIG. 10B and FIG. 11A and FIG. 11B, since the second embodiment and the first embodiment are the same, the corresponding figures and description thereof are omitted.

FIG. 21A, FIG. 22A, FIG. 23A and FIG. 24A show plane views showing the manufacturing method of the semiconductor memory device 1. FIG. 21B, FIG. 22B, FIG. 23B and FIG. 24B show cross-sectional views of the manufacturing method of the semiconductor memory device 1. Planes of FIG. 21A to FIG. 24A correspond to the plane of FIG. 19. Cross-sections of FIG. 21B to FIG. 24B correspond to the cross-section of FIG. 20. Here, hereinafter, the manufacturing method of the memory cell region Rm of the semiconductor memory device 1 is described.

Figure 21A:
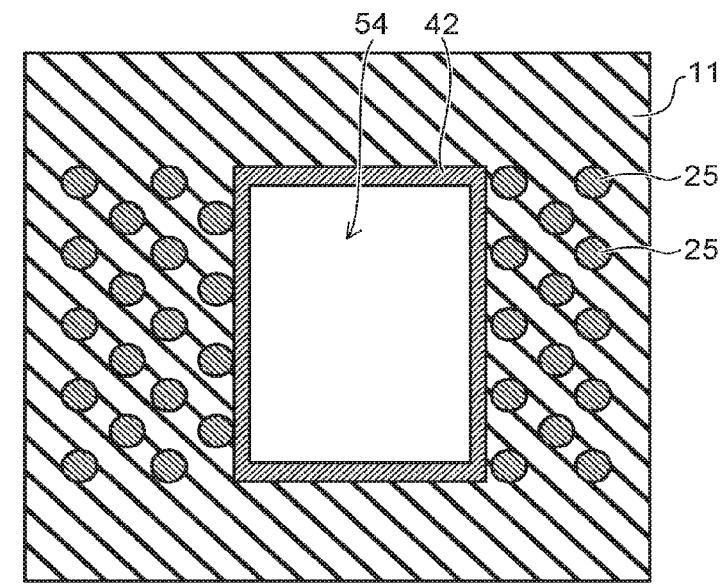
Figure 21B:
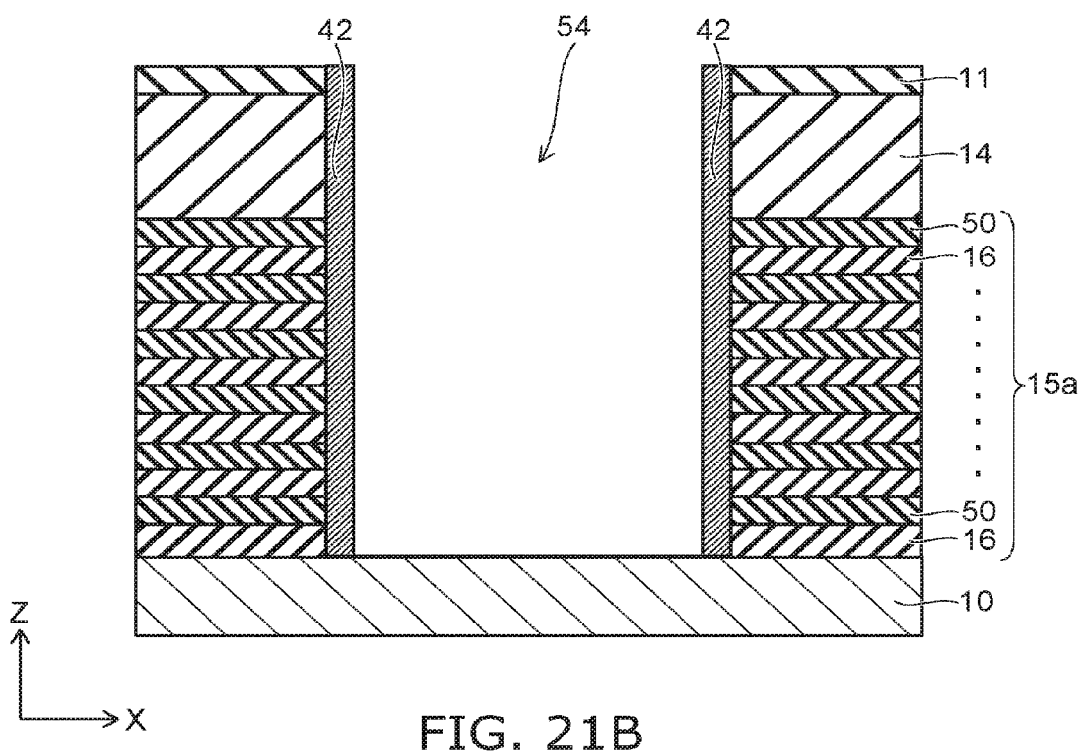

As shown in FIG. 21A and FIG. 21B, the hole 54 is formed by removing a portion of the stacked body 15a, a portion of the inter-layer insulating film 14, and a portion of the insulating film 11. While the columnar portion 25 located in a portion of the stacked body 15a is removed, a portion of the columnar portion 25 is left around the hole 54 without being removed. Thus, the enclosing portion 42 is formed. A portion of the electrode film 17 is divided by the hole 54. Further, the hole 54 divides the rows of the columnar portions 25 disposed in each of the electrode films 17.

Figure 22A:
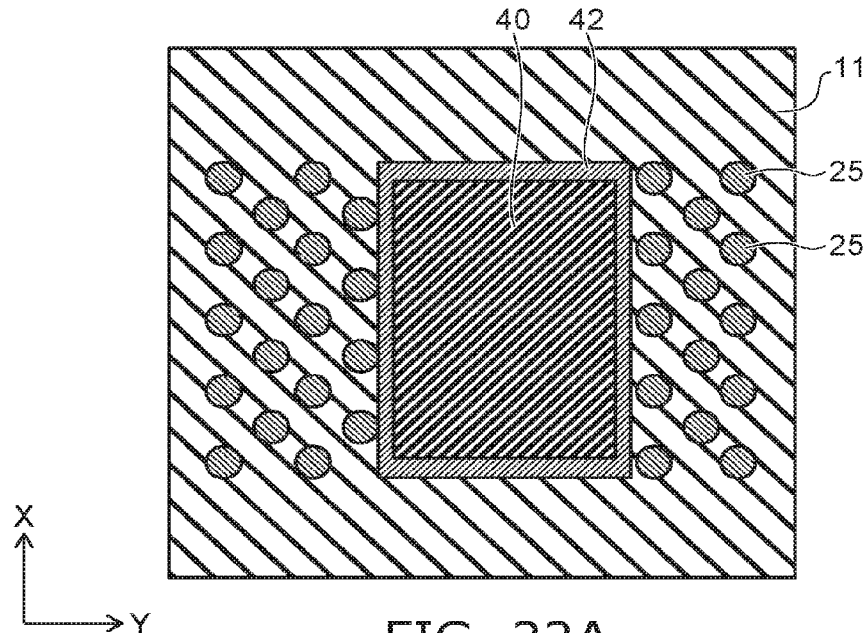
Figure 22B:
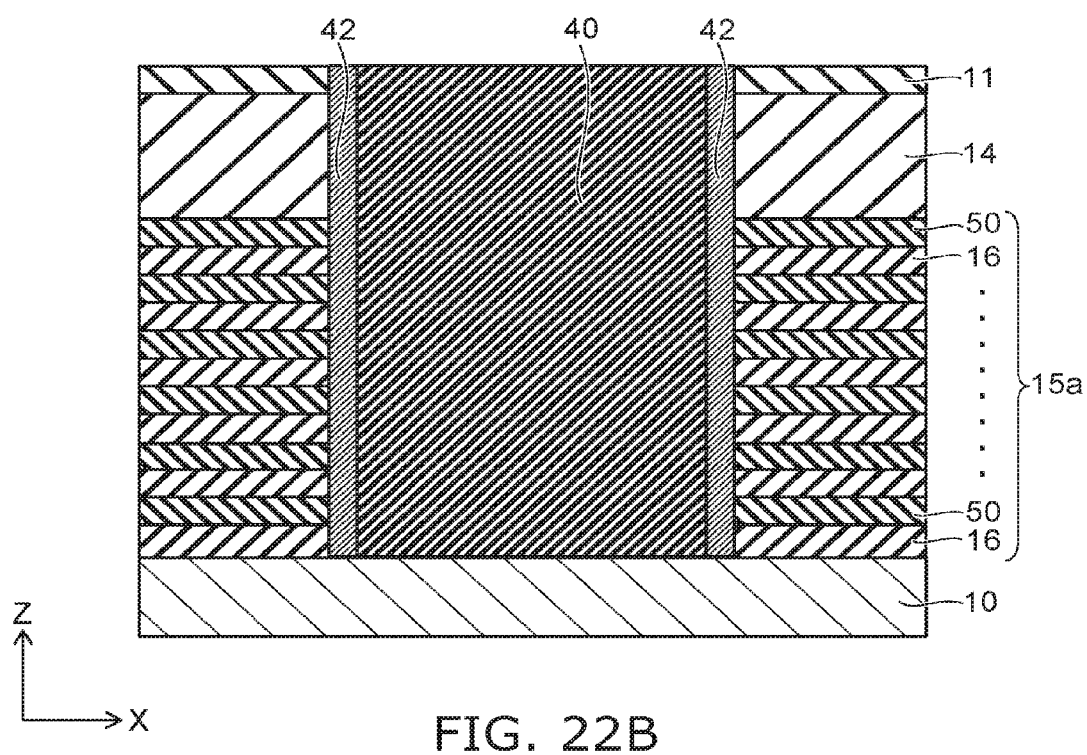

Next, as shown in FIG. 22A and FIG. 22B, the insulating member having compressive stress is formed in the hole 54. Thus, the columnar member 40 is formed. By the columnar member 40, a portion of the electrode film 17 extending in the Y-direction is divided, and the rows of the columnar portions 25 disposed in each of the electrode films 17 are divided. The enclosing portion 42 is formed on the side surface of the columnar member 40.

Figure 23A:
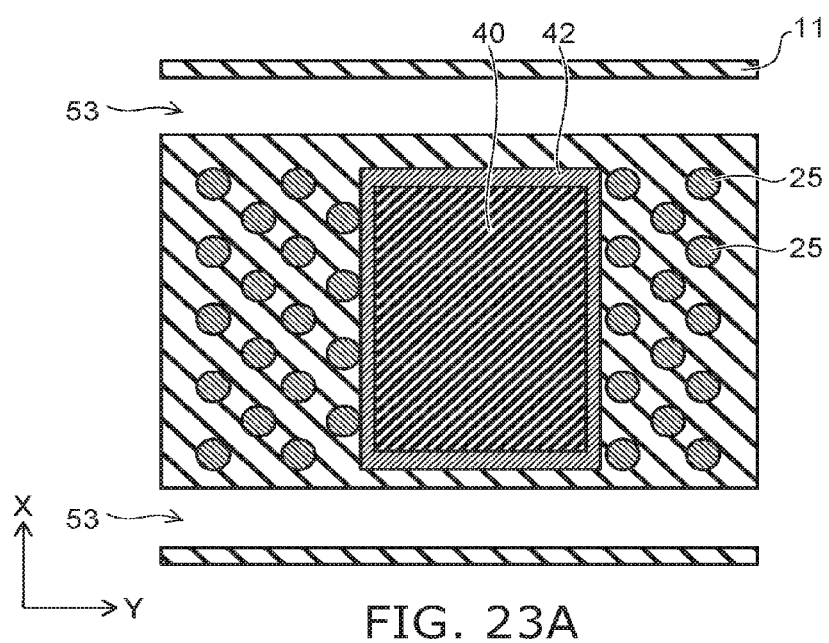
Figure 23B:
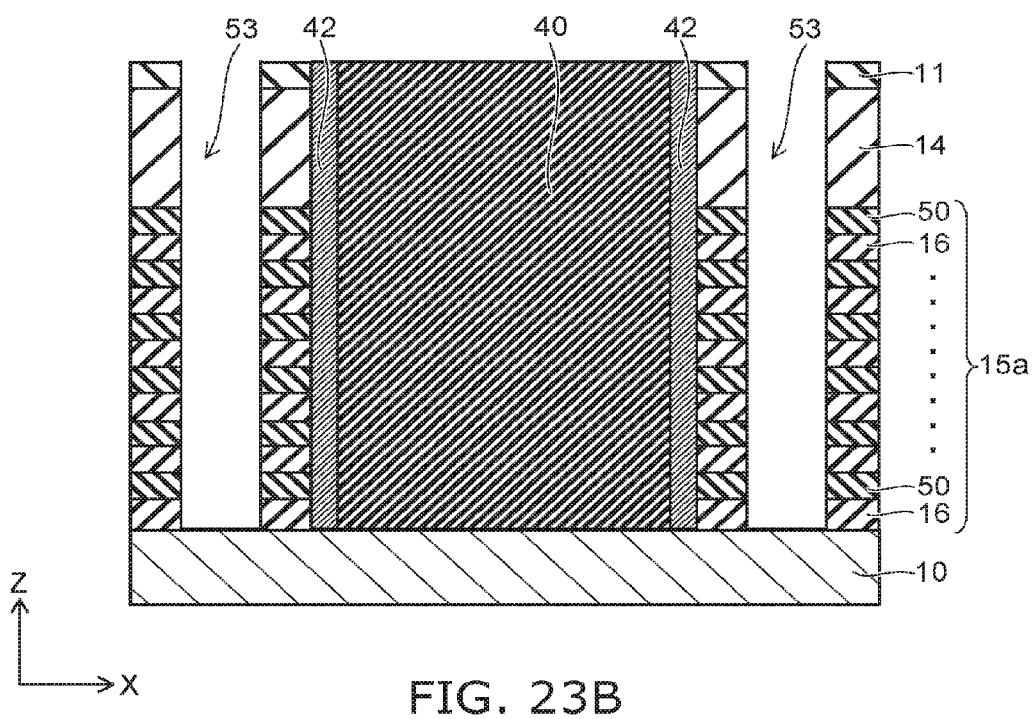

Next, as shown in FIG. 23A and FIG. 23B, by, for example, anisotropic etching such as RIE, the plurality of slits 53 extending in the Y-direction is formed in the stacked body 15a, the inter-layer insulating film 14 and the insulating film 11.

Figure 24A:
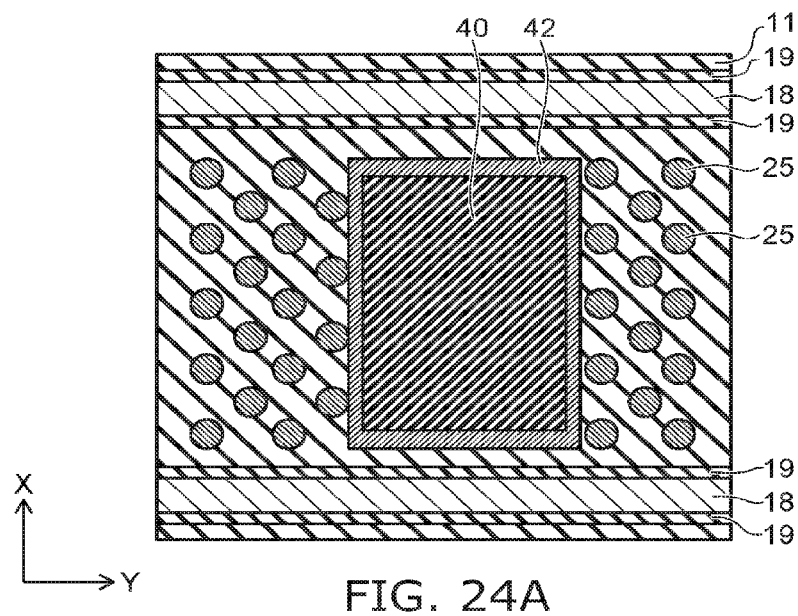
Figure 24B:
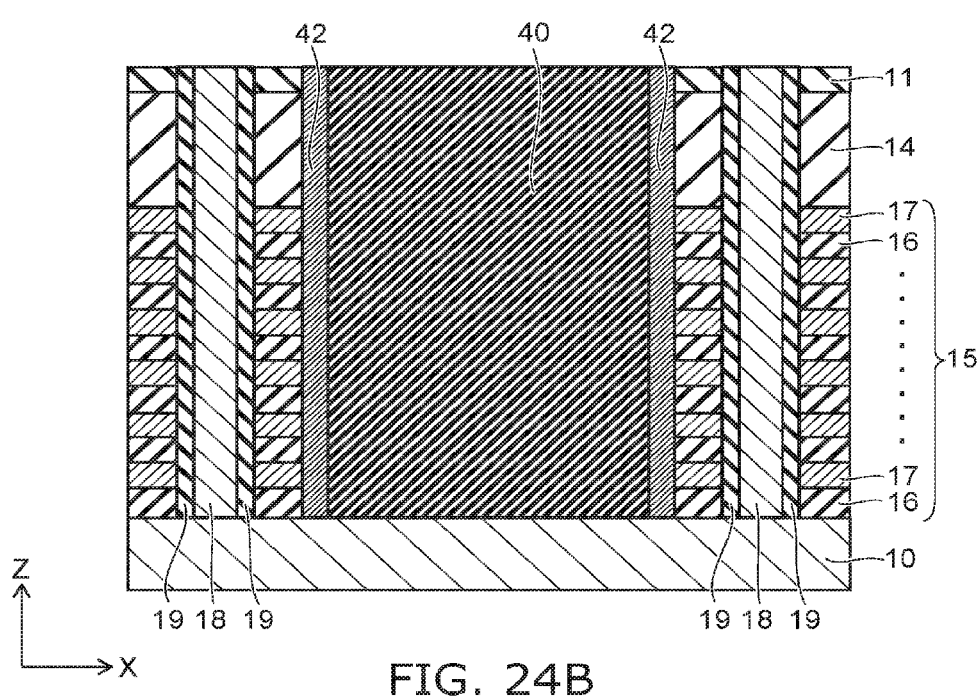

Next, as shown in FIG. 24A and FIG. 24B, after forming the cavity by removing the sacrifice film 50 via the slit 53, the electrode film 17 is formed by burying the conductive film in the cavity. Thus, the stacked body 15 is formed between the slits 53. Subsequently, the side wall 19 is formed on a side surface of the slit 53, and the conductive film is formed by depositing tungsten or molybdenum so as to be thick. Thus, the source electrode 18 is formed in the slit 53.

Thereafter, the plug 30 and bit line 31 are formed, and the plurality of semiconductor memory device 1 is divided by dicing the wafer.

In this manner, the semiconductor memory device 1 according to the embodiment is manufactured.

Hereinafter, an effect of the embodiment is described.

As the embodiment, the enclosing portion 42 is provided on the side surface 40s of the columnar member 40. By such the enclosing portion 42, at the forming of the columnar portion 25, it is possible to form the hole 54 and the columnar member 40 therein. Therefore, since the slit 53 and the hole 54 are not formed at the same time, it is possible to reduce a process performed via the slit 53 and the hole 54 (for example, when depositing the deposits in the hole 54, a process for using a mask or the like so as not to deposit the deposits in the slit 53). Thus, it is possible to reduce the number of the manufacturing processes of the semiconductor memory device 1. Further, by such the enclosing portion 42, the alignment at forming the hole 54 can be facilitated.

The other effects of the embodiment are the same as the first embodiment.

Third Embodiment

Figure 25:
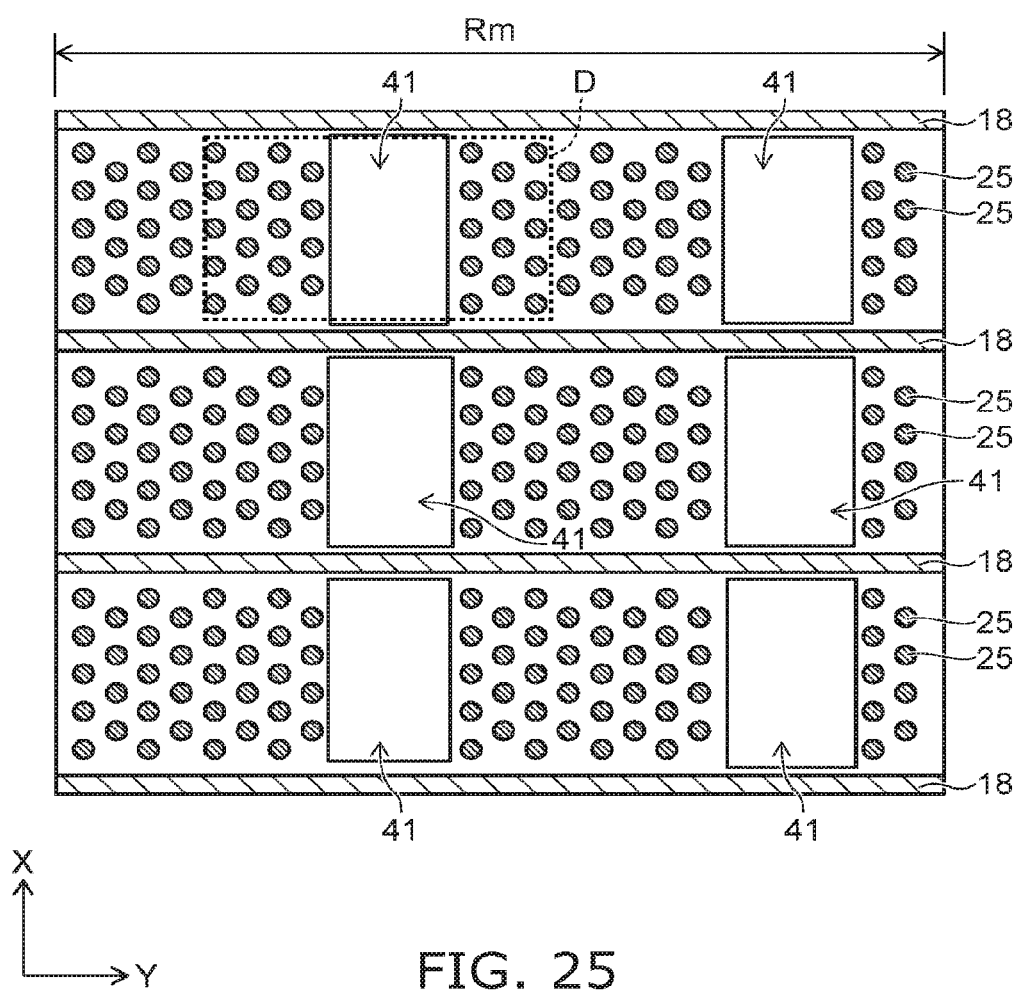
FIG. 25 is a plan view showing a part of a semiconductor memory device according to a third embodiment.

FIG. 25 is a plan view showing a part of the semiconductor memory device according to the third embodiment.

Figure 26:
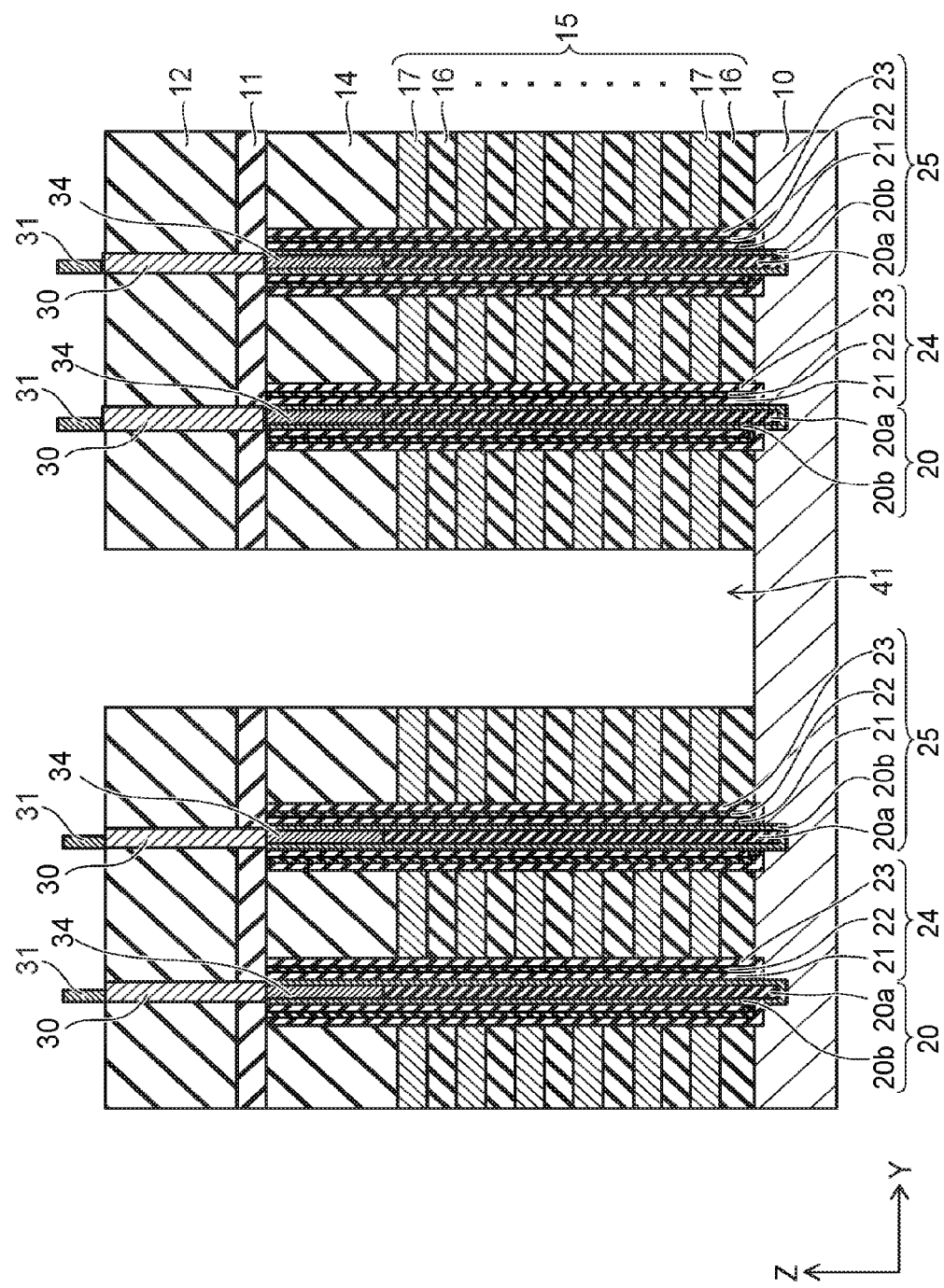
FIG. 26 is a cross-sectional view showing a part of the semiconductor memory device according to the third embodiment.

FIG. 26 is a cross-sectional view showing a part of the semiconductor memory device according to the third embodiment.

A plane of FIG. 25 corresponds to the plane of the memory cell region Rm of FIG. 1. FIG. 26 shows the Y-Z cross-sectional view of a region D of FIG. 25.

The third embodiment and the first embodiment differ in forming the plurality of gaps 41 in the memory cell region Rm. Since other configurations are the same as the first embodiment, the detailed description of other configurations is omitted.

As shown in FIG. 25, the gap 41 is formed between the source electrodes 18 adjacent in the X-direction. The plurality of gaps 41 is formed so as to be disposed in the Y-direction with a predetermined distance. As shown in FIG. 26, the gap 41 pierces the insulating film 12, the insulating film 11, the inter-layer insulating film 14 and the stacked body 15.

The gap 41 divides a portion of the electrode film 17 extending in the Y-direction, and the rows of the columnar portions 25 disposed in each of the electrode films 17. For example, as shown in FIG. 9, the gap 41 divides the portion of the electrode film 17 and the rows of the columnar portions 25.

As the embodiment, when the gap 41 is formed in the stacked body 15, it is possible that the Y-direction component (tensile stress or the like) of the stress occurring in the electrode film 17 is divided. Thus, it is possible to reduce the difference between the amount of warp in the X-direction of the substrate 10 and the amount of warp in the Y-direction of the substrate 10. Therefore, since it is possible to reduce the stress occurring in each of the electrode films 17, it is possible to suppress the warpage of the substrate 10 and to suppress the warpage and cracking of the wafer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    a substrate;
    a plurality of electrodes provided on the substrate, the electrodes being separately stacked and constituting a stacked body, the electrodes having a first width in a first direction along a surface of the substrate, the electrodes including a portion extending in a second direction along the surface, the second direction crossing the first direction;
    at least one pillar structure provided in the stacked body and including a semiconductor layer extending in a stacking direction of the stacked body;
    at least one charge storage film provided between the semiconductor layer and the electrodes; and
    at least one insulating member having a width in the first direction smaller than the first width of the electrodes, piercing the electrodes, and provided to extend in the stacking direction,
    wherein the at least one insulating member includes a first side and a second side that is opposite to the first side, and wherein surfaces of the at least one insulating member on the first side and the second side, respectively, are orthogonal to the second direction,
    wherein the at least one pillar structure includes a plurality of pillar structures provided on the first side and the second side of the at least one insulating member,
    wherein the at least one insulating member is formed in the stacked body, and
    wherein the electrodes of the stacked body are not divided by the at least one insulating member.

2. The device according to claim 1, wherein the insulating member includes silicon oxide.

3. The device according to claim 1, wherein the insulating member includes silicon nitride.

4. The device according to claim 1, wherein the insulating member pierces the stacked body.

5. The device according to claim 1, wherein a shape of the insulating member is a rectangular parallelepiped.

6. The device according to claim 1, wherein
    the insulating member includes a plurality of insulating members provided along the second direction, and
    the pillar structure includes a plurality of pillar structures disposed between the insulating members adjacent in the second direction.

7. The device according to claim 1, wherein
    the pillar structure includes a plurality of pillar structures disposed in a plurality of rows, and
    the insulating member divides each of the rows.

8. The device according to claim 1, wherein
    the electrodes are disposed in a first region, and
    the insulating member is not disposed at both end portions of the first region in the first direction.

9. The device according to claim 8, wherein the pillar structure is not disposed in the first region.

10. The device according to claim 1, further comprising:
    an enclosing portion covering a side surface of the insulating member,
    wherein the enclosing portion includes at least one of a material of the semiconductor layer and a material of the charge storage film.

11. The device according to claim 1, wherein the plurality of electrodes includes tungsten or molybdenum.

12. A semiconductor memory device comprising:
    a substrate;
    a plurality of electrodes provided on the substrate, the electrodes being separately stacked and constituting a stacked body, the electrodes having a first width in a first direction along a surface of the substrate, the electrodes including a portion extending in a second direction along the surface, the second direction crossing the first direction;
    at least one pillar structure provided in the stacked body and including a semiconductor layer extending in a stacking direction of the stacked body;
    at least one charge storage film provided between the semiconductor layer and the electrodes; and
    at least one gap being formed in the stacked body so as to pierce the electrodes,
    wherein a width of the gap in the first direction is smaller than the first width of the electrodes,
    wherein the at least one gap includes a first side and a second side that is opposite to the first side, and wherein surfaces of the at least one gap on the first side and the second side, respectively, are orthogonal to the second direction,
    wherein the at least one pillar structure includes a plurality of pillar structures provided on the first side and the second side of the at least one gap, and wherein the electrodes of the stacked body are not divided by the at least one gap.

13. The device according to claim 1, further comprising a plurality of embedded members provided in a plane along the second direction and the stacking direction, and that divide the stacked body into a plurality of partitions in the first direction,
wherein the at least one insulating member is disposed between the plurality of the embedded members in the first direction.

14. The device according to claim 13, wherein the at least one insulating member is arranged with the electrodes in the first direction between the plurality of the embedded members.

15. The device according to claim 1, wherein the at least one insulating member has the width in the first direction larger than an outer diameter of the at least one pillar structure.

16. The device according to claim 12, further comprising a plurality of embedded members provided in a plane along the second direction and the stacking direction, and that divide the stacked body into a plurality of partitions in the first direction,
wherein the at least one gap is disposed between the plurality of embedded members in the first direction.

17. The device according to claim 16, wherein the at least one gap is arranged with the electrodes in the first direction between the plurality of the embedded members.

18. A semiconductor memory device comprising:
a substrate;
a plurality of electrodes provided parallel to a first direction and a second direction parallel to a surface of the substrate, the electrodes being separately stacked and constituting a stacked body;
at least one pillar structure provided in the stacked body and including a semiconductor layer extending in a stacking direction of the stacked body;
at least one charge storage film provided between the semiconductor layer and the electrodes;
a plurality of embedded members provided in a plane along the second direction and the stacking direction, and that divide the stacked body into a plurality of partitions in the first direction; and
at least one insulating member extending in the stacking direction through the stacked body,
wherein the at least one insulating member includes a first side and a second side that is opposite to the first side, and wherein surfaces of the at least one insulating member on the first side and the second side, respectively, are orthogonal to the second direction,
wherein the at least one pillar structure includes a plurality of pillar structures provided on the first side and the second side of the at least one insulating member, and
wherein the at least one insulating member is formed such that the electrodes of the stacked body are not divided by the at least one insulating member in the first direction and the electrodes include a portion extending in the second direction between the plurality of the embedded members.

19. The device according to claim 18, wherein the at least one insulating member has a width in the first direction larger than an outer diameter of the at least one pillar structure.

* * * * *